United States Patent
Fukui et al.

(10) Patent No.: US 8,008,730 B2
(45) Date of Patent: Aug. 30, 2011

(54) SEMICONDUCTOR DEVICE, AND MANUFACTURING METHOD THEREOF

(75) Inventors: Shoichi Fukui, Tokyo (JP); Noboru Morimoto, Tokyo (JP); Yasutaka Nishioka, Tokyo (JP); Junko Izumitani, Tokyo (JP); Atsushi Ishii, Tokyo (JP)

(73) Assignee: Renesas Electronics Corporation, Osaka (JP)

( * ) Notice: Subject to any disclaimer, the term of this patent is extended or adjusted under 35 U.S.C. 154(b) by 87 days.

(21) Appl. No.: 12/502,008

(22) Filed: Jul. 13, 2009

(65) Prior Publication Data

US 2010/0052062 A1 Mar. 4, 2010

(30) Foreign Application Priority Data

Aug. 26, 2008 (JP) .................. 2008-217049

(51) Int. Cl.
*H01L 21/02* (2006.01)
(52) U.S. Cl. ...................... 257/384; 438/623
(58) Field of Classification Search .................. 257/384, 257/758, E21.495, E23.141; 438/623
See application file for complete search history.

(56) References Cited

U.S. PATENT DOCUMENTS

| | | | |
|---|---|---|---|
| 6,277,730 B1 | 8/2001 | Yuasa et al. | |
| 6,437,441 B1 | 8/2002 | Yamamoto | |
| 6,899,603 B2 * | 5/2005 | Homma et al. | 451/57 |
| 7,148,157 B2 * | 12/2006 | Choo et al. | 438/784 |
| 7,180,191 B2 | 2/2007 | Sasaki et al. | |
| 2008/0230847 A1 * | 9/2008 | Furusawa et al. | 257/384 |
| 2008/0283958 A1 * | 11/2008 | Ohnuma | 257/506 |
| 2009/0294984 A1 * | 12/2009 | Zhu | 257/774 |

FOREIGN PATENT DOCUMENTS

| | | |
|---|---|---|
| JP | 5-109910 | 4/1993 |
| JP | 6-053210 | 2/1994 |
| JP | 6-302704 | 10/1994 |
| JP | 7-153840 | 6/1995 |
| JP | 11-087510 | 3/1999 |
| JP | 11-317454 | 11/1999 |
| JP | 2005-136152 | 5/2005 |
| JP | 2005-223021 | 8/2005 |

* cited by examiner

*Primary Examiner* — Fernando L Toledo
(74) *Attorney, Agent, or Firm* — McDermott Will & Emery LLP

(57) ABSTRACT

To provide a manufacturing method of a semiconductor device which can improve the reliability of the semiconductor device. A first insulating film for covering a semiconductor element formed in a semiconductor substrate is formed by a thermal CVD method or the like which has a good embedding property. A second insulating film is formed to cover the first insulating film by a plasma CVD method which has excellent humidity resistance. A plug is formed to penetrate the first insulating film and the second insulating film. A third insulating film comprised of a low-k film having a relatively low dielectric constant is formed over the second insulating film. A wiring is formed in the third insulating film by a damascene technique to be electrically coupled to the plug.

11 Claims, 21 Drawing Sheets

SEMICONDUCTOR DEVICE, AND MANUFACTURING METHOD THEREOF

CROSS-REFERENCE TO RELATED APPLICATIONS

The disclosure of Japanese Patent Application No. 2008-217049 filed on Aug. 26, 2008 including the specification, drawings and abstract is incorporated herein by reference in its entirety.

BACKGROUND OF THE INVENTION

The present invention relates to semiconductor devices, and manufacturing methods thereof, and more particularly, to a manufacturing method of a semiconductor device using a damascene technique, and a semiconductor device manufactured by the method.

A plurality of semiconductor elements formed in a semiconductor substrate are electrically coupled to each other, for example, by multilayer wiring to form a predetermined circuit. With miniaturization of the semiconductor element, an embedded wiring structure has been developed as a wiring structure. The embedded wiring structure is formed by embedding wiring material in a wiring trench formed in an insulating film, or in a wiring opening, such as a hole, by the damascene technique. The damascene technique includes a single damascene process, and a dual damascene process.

For example, Patent Document 1 has proposed a technique in which a copper wiring is formed by the damascene technique in a three-layered structure including an insulating film, such as a silicon nitride film, a silicon oxide nitride film, a silicon carbide film, or a silicon carbide-nitride film, another insulating film formed thereon and comprised of organic polymer low-dielectric constant insulating material, and a further insulating film formed thereon, such as a silicon nitride film, a silicon carbide film, or a silicon carbide-nitride film. Patent Document 2 has proposed a technique for controlling a composition of carbon of a SiOC film having a copper wiring formed by the damascene technique.

Patent Document 3 discloses a manufacturing method of a semiconductor device which includes the steps of embedding siloxane SOG in between gate electrodes by a coating method, forming a fluorinated silicone oxide film on the siloxane SOG by a plasma CVD method, and forming a contact hole reaching a semiconductor substrate through the siloxane SOG and the fluorinated silicone oxide film. The manufacturing method further includes the steps of forming a fluorinated polyimide film over the fluorinated silicon oxide film by the coating method, forming a wiring trench reaching the fluorinated silicon oxide film by etching the fluorinated polyimide film according to a wiring trench pattern, and embedding conductive material in the contact hole and the wiring trench to form wirings.

Patent Document 4 discloses a semiconductor device with an aluminum multilayer wiring structure, and proposes a technique for holding aluminum wiring by a SiON film formed by the plasma CVD method so as to prevent harmful influence on insulation resistance or the like of the aluminum wiring due to moisture absorbed from the air by a SiOF film serving as an interlayer film formed by the plasma CVD method.

Patent Document 5 discloses a wiring layer structure including an ozone TEOS (tetraethoxysilane) film as an lower layer, and a plasma oxide film as an upper layer. Patent Document 6 discloses a technique for forming a moisture-resistant multilayer interlayer film by forming a silicon oxide film as an interlayer insulating film on a thermal CVD film including organic silane and ozone by the plasma CVD method. Patent Document 7 discloses a technique for forming silicon rich oxide films above and under a plasma CVD film containing fluorine serving as a low dielectric constant film in a wiring layer so as to prevent diffusion of fluorine from the plasma CVD oxide film containing the fluorine. Further, Patent Document 8 discloses a structure including moisture-resistant insulating films (of silicon nitride) formed in upper and lower positions of a wiring layer, and a hygroscopic ozone TEOS film formed therebetween.

After forming a semiconductor element, such as a metal insulator semiconductor field effect transistor (MISFET), over a main surface of a semiconductor substrate, an interlayer insulating film is formed over the main surface of the semiconductor substrate so as to cover the semiconductor element. In recent years, a gap between gate electrodes of the MISFETs has become smaller with miniaturization of the semiconductor elements. An insulating film having good embedded properties into between the gate electrodes or the like is desired to be used in such an interlayer insulating film. The insulating film formed by the plasma chemical vapor deposition (CVD) method has the low embedded properties, and thus cannot be surely embedded in a space between the gate electrodes when the space therebetween is relatively narrow, which may generate voids. In contrast, an insulating film, such as an $O_3$-TEOS (tetraethoxysilane) oxide film, formed by the thermal CVD, or an insulating film, such as the spin on glass (SOG) film, formed by the coating method has good embedded properties into a space between the gate electrodes or the like.

[Patent Document 1] Japanese Unexamined Patent Publication No. 2005-136152
[Patent Document 2] Japanese Unexamined Patent Publication No. 2005-223021
[Patent Document 3] Japanese Unexamined Patent Publication No. Hei 11(1999)-87510
[Patent Document 4] Japanese Unexamined Patent Publication No. Hei 6(1994)-302704
[Patent Document 5] Japanese Unexamined Patent Publication No. Hei 7(1995)-153840
[Patent Document 6] Japanese Unexamined Patent Publication No. Hei 5(1993)-109910
[Patent Document 7] Japanese Unexamined Patent Publication No. Hei 11(1999)-317454
[Patent Document 8] Japanese Unexamined Patent Publication No. Hei 6(1994)-53210

SUMMARY OF THE INVENTION

The related art, however, has the following problems. An insulating film with excellent embedded properties, such as an $O_3$-TEOS oxide film or a SOG film, has a high hygroscopic property as compared to an insulating film formed by the plasma CVD method. Thus, on a stage of forming such an insulating film, the film tends to absorb moisture or water, which results in high content of moisture in the insulating film. The term "moisture content" as used herein means contents of both moisture and OH group. Such an insulating film having the excellent embedded properties and the high content of moisture is formed as an interlayer insulating film, and a contact hole is formed in the interlayer insulating film with a plug embedded therein. Further, another insulating film is formed on the interlayer insulating film thereby to form wiring by the damascene technique. It has been found that the reliability of the wiring may be reduced due to the high content of moisture in the interlayer insulating film.

That is, the inventors have found through studies that when another insulating film with low humidity resistance is formed on the interlayer insulating film which has the high hygroscopic property and which tends to have a large content of moisture, an interface between the interlayer insulating film and another insulating film becomes electrically weak. Thus, dielectric breakdown tends to occur via the interface even without the diffusion of copper (Cu) in a copper wiring.

In the technique disclosed in Patent Document 3, an interlayer insulating film of a lowermost layer having wirings formed therein is also formed by the coating method, and contain a large amount of moisture. Thus, the reliability regarding insulation resistance due to a leak current between the wirings, or due to a leak current between the wiring and a contact cannot be assured.

Further, in the technique disclosed in Patent Document 4, all insulating films formed over the semiconductor substrate are formed by the plasma CVD method. Based on the technique in Patent Document 4, an interlayer insulating film is embedded in between gate electrodes. However, it is difficult to embed the interlayer insulating film in between the gate electrodes while making a space between the electrodes as small as possible. An aluminum wiring is held in by a SiON film having a relatively high dielectric constant, which leads to a large delay of wiring, thus making it difficult to speed up an operation of a semiconductor device.

The technique disclosed in Patent Document 5 does not take into consideration an interlayer film and a wiring structure formed on a plasma oxide film at all, and thus cannot obtain both the high-speed operation and reliability of an integrated circuit.

Further, in the technique disclosed in Patent Document 6, when a thermal CVD film including an organic silane and ozone, and a silicon oxide film formed by the plasma CVD method are laminated, the thermal CVD film of the organic silane and ozone to be embedded in a space between the wirings contains a large amount of moisture. As a result, the lamination structure cannot assure the reliability regarding insulation resistance due to the leak current between wirings, or due to the leak current between the wiring and a contact.

In the technique disclosed in Patent Document 7, since a main interlayer film is formed by the plasma CVD method, the use of the interlayer film as an interlayer film for embedding gate electrodes deteriorates the embedded property in between wirings. The wiring is held in by a silicon rich oxide film having a relatively high dielectric constant, which leads to a large delay of wiring, thus making it difficult to speed up the operation of the semiconductor device.

Further, in the technique disclosed in Patent Document 8, first, after forming a wiring material, the wiring material is etched to form a plurality of wirings. Thereafter, a silicon nitride film is formed to be embedded in a space between the wirings and over the wirings. An ozone TEOS film is formed over the silicon nitride film to be embedded in the space between the wirings and over the wirings. Further, another silicon nitride film is formed over the TEOS film to be embedded in a space between the wirings and over the wirings. The multilayer wiring structure is formed based on this method, so that two layers of the silicon nitride films having the high dielectric constant exist in between the wirings. Thus, the technique of Patent Document 8 results in a large delay of wiring, making it difficult to speed up the operation of the semiconductor device.

Accordingly, the present invention has been made so as to solve the forgoing problems, and it is an object of the present invention to provide a manufacturing method of a semiconductor device which can improve the reliability of the semiconductor device. Further, it is another object of the invention to provide a semiconductor device manufactured by such a method.

A manufacturing method of a semiconductor device according to the invention includes the following steps. A first gate electrode and a second gate electrode are formed over a semiconductor substrate having a main surface to be spaced apart from each other. A first interlayer insulating film is formed in a region between the first gate electrode and the second gate electrode over the semiconductor substrate by at least one of a thermal chemical vapor deposition method and a coating method in such a manner that the interlayer insulating film is at a higher level than those of the first gate electrode and the second gate electrode. A second interlayer insulating film is formed over the first interlayer insulating film by a plasma chemical vapor deposition method. A first plug electrode is formed through the second interlayer insulating film and the first interlayer insulating film to be electrically coupled to the semiconductor substrate. A third interlayer insulating film having a predetermined dielectric constant is formed over the second interlayer insulating film by the plasma chemical vapor deposition method so as to cover the first plug electrode. A wiring trench for exposing the second interlayer insulating film, and the first plug electrode is formed by etching the third interlayer insulating film. The wiring is electrically coupled to the semiconductor substrate via the first plug electrode by forming the wiring in the wiring trench.

Another manufacturing method of a semiconductor device according to the invention includes the following steps. A first gate electrode and a second gate electrode are formed over a semiconductor substrate having a main surface to be spaced apart from each other. A first interlayer insulating film is formed in a region between the first gate electrode and the second gate electrode over the semiconductor substrate by at least one of a thermal chemical vapor deposition method and a coating method in such a manner that the interlayer insulating film is at a higher level than those of the first gate electrode and the second gate electrode. A first plug electrode is formed through the first interlayer insulating film to be electrically coupled to the semiconductor substrate. A predetermined thermal treatment is applied for removing moisture contained in the first interlayer insulating film. A second interlayer insulating film is formed over the first interlayer insulating film by a plasma chemical vapor deposition method so as to cover the first plug electrode. A third interlayer insulating film having a predetermined dielectric constant is formed over the second interlayer insulating film by the plasma chemical vapor deposition method. A wiring trench for exposing the first interlayer insulating film and the first plug electrode is formed by etching the third interlayer insulating film and the second interlayer insulating film. The wiring is electrically coupled to the semiconductor substrate via the first plug electrode by forming the wiring in the wiring trench.

A semiconductor device according to the invention includes a semiconductor substrate, a first gate electrode, a second gate electrode, a first interlayer insulating film, a second interlayer insulating film, a first plug electrode, a third interlayer insulating film, a wiring trench, and a wiring. The semiconductor substrate has a main surface. The first gate electrode and the second gate electrode are formed over the semiconductor substrate so as to be spaced apart from each other. The first interlayer insulating film is formed in a region between the first gate electrode and the second gate electrode over the semiconductor substrate in such a manner that the interlayer insulating film is at a higher level than those of the first gate electrode and the second gate electrode. The first interlayer insulating film has a predetermined content density of moisture and OH group, and has a predetermined dielectric constant. The second interlayer insulating film is formed over the first interlayer insulating film, has a content density of moisture and OH group lower than the predetermined content density, and has another predetermined dielectric constant. The first plug electrode is formed through the second interlayer insulating film and the first interlayer insulating film to be electrically coupled to the semiconductor substrate. The third interlayer insulating film is formed over the second interlayer insulating film so as to cover the first plug electrode. The third interlayer insulating film is comprised of material having a further predetermined dielectric constant lower than the respective predetermined dielectric constants of the first and second interlayer insulating films, and lower than a dielectric constant of a silicon oxide film. The third interlayer insulating film has a content density of moisture and OH group lower than the predetermined content density. The wiring trench exposes the second interlayer insulating film and the first plug electrode through the third interlayer insulating film. A wiring is formed in the wiring trench and electrically coupled to the semiconductor substrate via the first plug electrode.

According to the manufacturing method of a semiconductor device in one embodiment of the invention, the first interlayer insulating film covering the gate electrode is formed by at least one of the thermal chemical vapor deposition method and the coating method, and thus can be embedded well in a region between the adjacent gate electrodes. The first interlayer insulating film whose hygroscopic property of moisture becomes high by being formed by the thermal chemical vapor deposition method or the like is covered with the second interlayer insulating film whose humidity resistance becomes high by being formed by the plasma chemical vapor deposition method. Thus, the moisture in the first interlayer insulating film is prevented from being diffused upward from the first interlayer insulating film, so that a dielectric breakdown route can be prevented from being formed due to moisture at an interface between the second interlayer insulating film and the third interlayer insulating film where the bottom of the wiring is in contact with the upper surface of the first plug. As a result, the wiring can be surely coupled electrically to the first plug, while ensuring insulation between the adjacent wirings, which can assure the reliability of the semiconductor device.

According to the manufacturing method of a semiconductor device in another embodiment of the invention, the first interlayer insulating film which is formed by the thermal chemical vapor deposition method to have the high hygroscopic property is subjected to the thermal treatment to remove the moisture contained in the insulating film. The first interlayer insulating film whose moisture is removed is covered with the second interlayer insulating film which is formed by the plasma chemical vapor deposition method to have the high humidity resistance. Thus, the formation of the dielectric breakdown route at the interface between the first interlayer insulating film and the second interlayer insulating film can be suppressed. As a result, the reliability of the semiconductor device can be improved.

According to a semiconductor device in a further embodiment of the invention, the second interlayer insulating film and the third interlayer insulating film through which the first plug electrode is formed have a content density of moisture and OH group lower than the predetermined content density of the first interlayer insulating film. The third interlayer insulating film having the wiring trench and wiring formed therein is comprised of material having another predetermined dielectric constant lower than the respective predetermined dielectric constants of the first and second interlayer insulating films, and lower than a dielectric constant of a silicon oxide film. Thus, the moisture in the first interlayer insulating film is prevented from being diffused upward from the first interlayer insulating film, so that the dielectric breakdown route can be prevented from being formed due to moisture at the interface between the second interlayer insulating film and the third interlayer insulating film where the bottom of the wiring is in contact with the upper surface of the first plug. As a result, the wiring can be surely coupled electrically to the first plug, while ensuring insulation between the adjacent wirings, which can assure the reliability of the semiconductor device.

DETAILED DESCRIPTION OF THE PREFERRED EMBODIMENTS

First Embodiment

Figure 1:
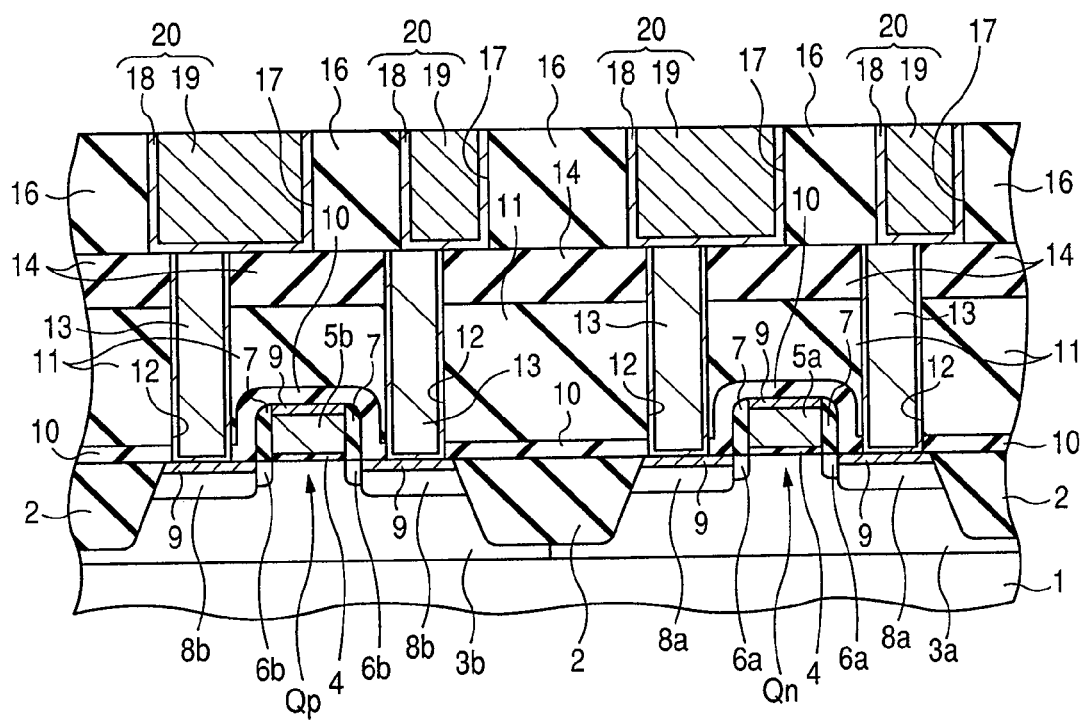
FIG. 1 is a sectional view showing a semiconductor device according to a first embodiment of the invention.

Now, a semiconductor device according to a first embodiment of the invention will be described below. As shown in FIG. 1, in a semiconductor device of this embodiment, an insulating film 11 covering a semiconductor element formed over a semiconductor substrate 1 is formed by a thermal CVD method or the like, which has a good embedding property. An insulating film 14 is formed so as to cover the insulating film 11 by a plasma CVD method, which has excellent humidity resistance. Plugs 13 are formed through the insulating film 11 and the insulating film 14. An insulating film 16 comprised of a low-k film having a relatively low dielectric constant is formed on the insulating film 14. A wiring 20 electrically coupled to the plug 13 is formed in the insulating film 16 by a damascene technique.

The structure of the semiconductor device will be further described in detail below. Semiconductor elements including MISFETs Qn and Qp are formed on a main surface of the semiconductor substrate 1. An insulating film 10 is formed over the surface of the semiconductor substrate 1 so as to cover the MISFETs Qn and Qp. The insulating film 11 is formed on the insulating film 10 by the thermal CVD method. The insulating film 14 is formed on the insulating film 11 by the plasma CVD method. The insulating film 11 is formed over the main surface of the semiconductor substrate 1 having the semiconductor elements, such as the MISFET, formed therein so as to be embedded in a space between gate electrodes 5a and 5b of the MISFETs.

The insulating film 14 has the larger number density of silicon (Si) atoms than that of the insulating film 11, and the lower hygroscopic property than that of the insulating film 11. Contact holes 12 are formed in the insulating films 10, 11, and 14. Each plug 13 is embedded in the contact hole 12. The plug 13 is electrically coupled to a source region or a drain region ($n^-$-type semiconductor region 6a, $n^+$-type semiconductor region 8a, $p^-$-type semiconductor region 6b, or $p^+$-type semiconductor region 8b) of the MISFET. Further, the plug 13 is electrically coupled to a gate electrode (not shown). The insulating film 14 is formed on the insulating film 11, and the insulating film 16 is formed on the insulating film 14. That is, the insulating film 11 is not in direct contact with the insulating film 16, and the insulating film 14 intervenes in between the insulating film 11 and the insulating film 16.

Openings 17 are formed in the insulating film 16. The wiring 20 is embedded in the opening 17. At least a part of an upper surface of the plug 13 is exposed to the bottom of the opening 17, and the wiring 20 is electrically coupled to the plug 13. The wiring 20 is comprised of the lowermost wiring layer among a plurality of wiring layers formed over the semiconductor substrate 1. Material for each of the insulating films 10, 11, 14, and 16 will be described below.

Figure 2:
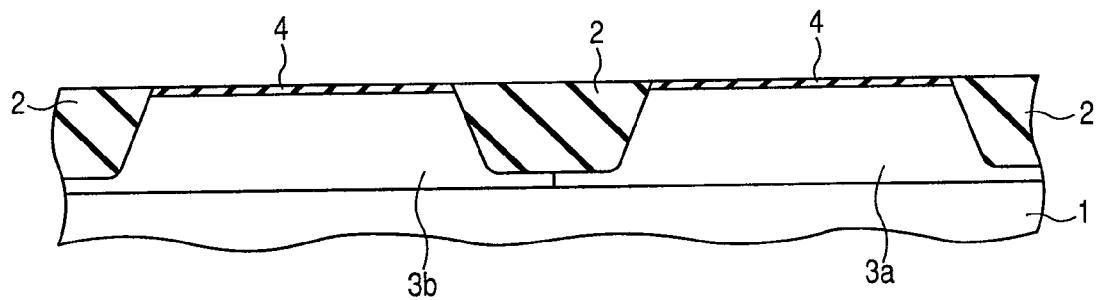
FIG. 2 is a sectional view showing one step in a manufacturing method of the semiconductor device according to the first embodiment.

Next, a manufacturing method of the above-mentioned semiconductor device will be described below. First, as shown in FIG. 2, a semiconductor substrate (semiconductor wafer) 1 comprised of p-type single crystal silicon having a specific resistance of, for example, about 1 to 10 Ωcm is prepared. Then, element separation regions 2 are formed in the main surface of the semiconductor substrate 1. The element separation region 2 is formed of a silicon oxide film or the like, for example, by a shallow trench isolation (STI) method, a local oxidization of silicon (LOCOS) method, or the like.

Then, a p-type well 3a is formed in a region of the semiconductor substrate 1 where the n channel-type MISFET of the semiconductor 1 is to be formed. Further, an n-type well 3b is formed in a region of the semiconductor substrate 1 where the p channel-type MISFET is to be formed. The p-type well 3a is formed by performing ion implantation of p-type impurities, such as boron (B). The n-type well 3b is formed by performing ion implantation of n-type impurities, such as phosphorus (P) or arsenic (As).

Figure 3:
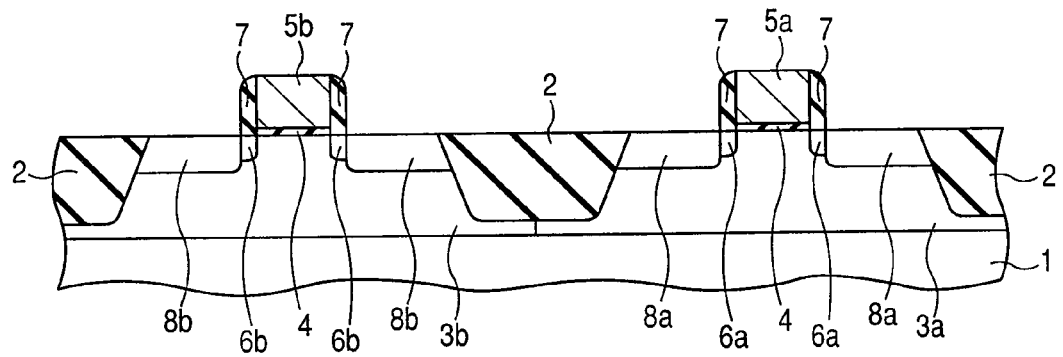
FIG. 3 is a sectional view showing another step performed after the step shown in FIG. 2 in the first embodiment.

Then, a gate insulating film 4 is formed on the surface of the semiconductor substrate 1 (the surface of each of the p-type well 3a and the n-type well 3b). The gate insulating film 4 is formed of, for example, a thin silicon oxide film by a thermal oxidation method or the like. Then, as shown in FIG. 3, a gate electrode 5a is formed on the gate insulating film 4 of the p-type well 3a. Further, a gate electrode 5b is formed on the gate insulating film 4 of the n-type well 3b. The gate electrodes 5a and 5b are comprised of, for example, a polysilicon film (doped polysilicon film) and the like.

In formation of the gate electrodes 5a and 5b, first, a polysilicon film is formed over the semiconductor substrate 1. Then, the n-type impurities, such as phosphorous (P) or arsenic (As), are ion-implanted into a part of the polysilicon film located in a region where the n-channel type MISFET is to be formed, using a photoresist film (not shown) as a mask, so that the part of the polysilicon film becomes a low-resistance n-type semiconductor film. Then, the p-type impurities, such as boron (B), are ion-implanted into a part of the polysilicon film located in a region where the p-channel type MISFET is to be formed, using another photoresist film (not shown) as a mask, so that the part of the polysilicon film becomes a low-resistance p-type semiconductor film. Then, the polysilicon film is patterned using a photolithography method and a dry etching method to form the gate electrodes 5a and 5b.

Then, n-type impurities, such as phosphorus (P), are ion-implanted into the region of the p-type well 3a using the gate electrode 5a as a mask thereby to form an n⁻-type semiconductor region 6a having a low impurity concentration. Further, p-type impurities, such as boron (B), are ion-implanted into the region of the n-type well 3b using the gate electrode 5b as a mask thereby to form a p⁻-type semiconductor region 6b having a low impurity concentration. Then, a side wall insulating film 7 comprised of, for example, a silicon oxide film, is formed on each side wall of the gate electrodes 5a and 5b. Specifically, the side wall insulating film 7 is formed by forming a silicon oxide film over the semiconductor substrate 1, and by applying anisotropic etching to the silicon oxide film.

Then, n-type impurities, such as phosphorus (P), are ion-implanted into the p-type well 3a using the gate electrode 5a and the side wall insulating film 7 as a mask to form n⁺-type semiconductor regions (source and drain) 8a. Further, p-type impurities, such as boron (B), are ion-implanted into the n-type well 3b using the gate electrode 5b and the side wall insulating film 7 as a mask to form p⁺-type semiconductor regions (source and drain) 8b. The n⁺-type semiconductor region 8a has an impurity concentration higher than that of the n⁻-type semiconductor region 6a, and the p⁺-type semiconductor region 8b has an impurity concentration higher than that of the p⁻-type semiconductor region 6b.

Figure 4:
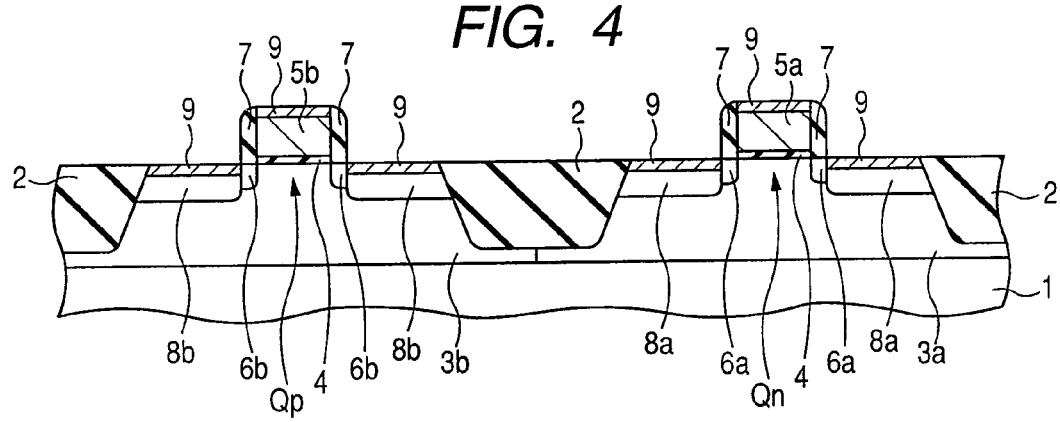
FIG. 4 is a sectional view showing another step performed after the step shown in FIG. 3 in the first embodiment.

Then, the surfaces of the gate electrodes 5a and 5b, the n⁺-type semiconductor region 8a, and the p⁺-type semiconductor region 8b are exposed, and a metal film (not shown), for example, a nickel (Ni) film is formed to cover these surfaces. As shown in FIG. 4, the metal film is subjected to predetermined thermal treatment, so that a metal silicide layer 9 is formed over each of the surfaces of the gate electrodes 5a and 5b, the n⁺-type semiconductor region 8a, and the p⁺-type semiconductor region 8b. Thus, the diffusion resistance of the n⁺-type semiconductor region 8a and the p⁺-type semiconductor region 8b, and the contact resistance can be decreased. Thereafter, the non-reacted metal film (nickel film) is removed.

In the semiconductor device of this embodiment, the metal silicide layer 9 is not a cobalt silicide layer, but may be preferably a nickel silicide layer from the requirement of reduction in resistance for miniaturization. The use of the nickel silicide layer as the metal silicide layer 9 can further reduce the resistance of the metal silicide layer 9, further enabling reduction in diffusion resistance and contact resistance of the n⁺-type semiconductor region 8a and the p⁺-type semiconductor region 8b. The nickel silicide has low heat resistance as compared to the cobalt silicide. The phase dislocation is caused in the nickel silicide at about 500° C. Thus, attention should be paid to the fact that the wafer after forming the metal silicide layer 9 can be applied to only thermal treatment at a temperature of about 500° C. or less. In this way, the n-channel type MISFET Qn is formed in the p-type well 3a of the semiconductor substrate 1, and the p-channel type MISFET Qp is formed in the n-type well 3b thereof.

Figure 5:
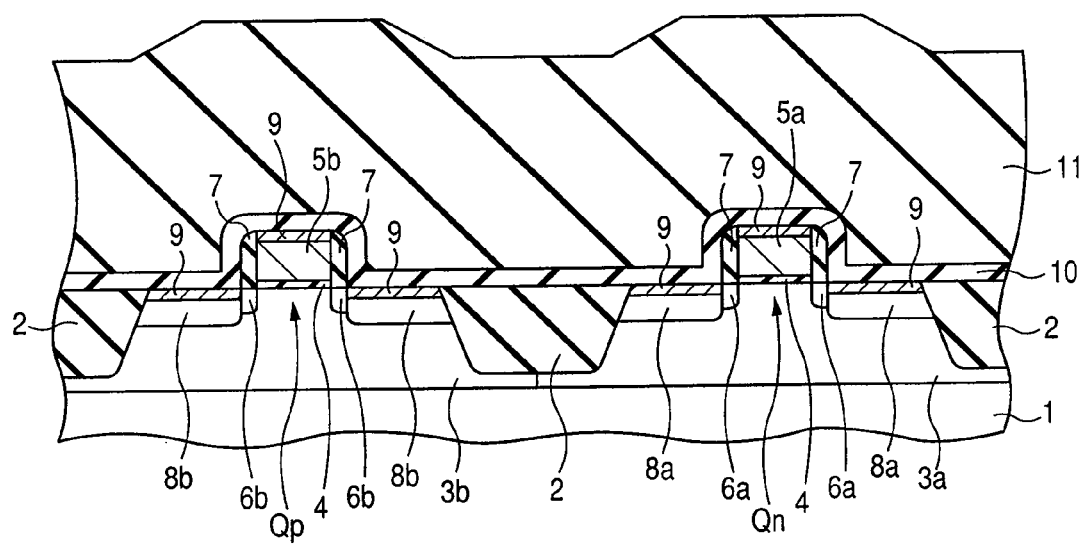
FIG. 5 is a sectional view showing another step performed after the step shown in FIG. 4 in the first embodiment.

Then, as shown in FIG. 5, the insulating film 10 comprised of a silicon nitride film or the like is formed over the surface of the semiconductor substrate 1 so as to cover the gate electrodes 5a and 5b and the side wall insulating films 7. The insulating film (first interlayer insulating film) 11 comprised of a silicon oxide film or the like is formed by the thermal CVD method to cover the insulating film 10. At this time, the insulating film 11 is formed to fill a space between the gate electrodes 5a and 5b of the MISFETs Qn and Qp. In other words, the insulating film 11 is formed over the semiconductor substrate in such a manner that the insulating film 11 is at a higher level than those of the gate electrodes 5a and 5b in at least a region between the gate electrodes 5a and 5b.

The thickness of the insulating film 10 is smaller than that of the insulating film 11. The insulating film 11 is one functioning as an interlayer insulating film, and the insulating film 10 is an insulating film as an etching stopper film in forming the contact holes in the insulating film 11. The insulating films 10 and 11 are comprised of respective materials having different etching properties (etching rates). For example, preferably, the insulating film 10 is a silicon nitride film, and the insulating film 11 is a silicon oxide film.

In the semiconductor device of this embodiment, the insulating film 11 is an insulating film containing silicon (Si) and oxygen (O) as components, preferably, silicon (Si) and oxygen (O) as principal components, and more preferably, a silicon oxide ($SiO_x$) film. The silicon oxide film is generally a silicon dioxide film ($SiO_2$), but may include any other silicon oxide film whose atomic ratio (ratio of the number of atoms) of oxygen (O)/silicon (Si) deviates from the stoichiometric proportion ($SiO_2$) in the semiconductor device of this embodiment.

The composition ratio of oxygen (O) to silicon (Si) in the insulating film 11, that is, the ratio of the number of atoms of oxygen (O) to silicon (Si) (O atom number/Si atom number) is preferably equal to or more than 1.5. In this case, the insulating film 11 has the ratio of the oxygen (O) content to the silicon (Si) content of 1.5 or more in terms of the ratio of the number of atoms. When the composition of the insulating film 11 is represented by "$SiO_x$", the reference character X is equal to or more than 1.5 ($X \geq 1.5$).

The insulating film 11 may further contain carbon (C) in a minute amount. In this case, the composition ratio of carbon (C) to silicon (Si) in the insulating film 11, that is, the ratio of the number of atoms of carbon (C) to silicon (Si) (C atom number/Si atom number) is preferably equal to or less than 0.05. In this case, the insulating film 11 has the ratio of the carbon (C) content to the silicon (Si) content of 5% or less in terms of the ratio of the number of atoms. When the composition of the insulating film 11 is represented as "$SiO_xC_y$," the character X of the $SiO_xC_y$ is equal to or more than 1.5 ($X \geq 1.5$), and the reference character Y thereof is equal to or less than 0.05 ($Y \leq 0.05$). The insulating film 11 may further contain hydrogen (H).

In recent years, a space between gate electrodes of MISFETs has become smaller with minituarization of semiconductor devices. Thus, the insulating film 11 to be formed so as to fill the space between the gate electrodes is desirably an insulating film having good embedded properties in use. The insulating film formed by the plasma CVD method has a relatively bad embedded property, and thus cannot be sufficiently embedded in the small space between the gate electrodes, which may generate voids. In contrast, an insulating film formed by the thermal CVD method, such as an $O_3$-TEOS oxide film, or an insulating film formed by the coating method, such as a SOG film, is one having a good embedded property into the space between the gate electrodes or the like. Thus, in the semiconductor device of this embodiment, the insulating film 11 in use is not an insulating film formed by the plasma CVD method, but an insulating film formed by the thermal CVD method or coating method.

That is, in the semiconductor device of this embodiment, the insulating film 11 is comprised of an insulating film which can be embedded in a narrow space between the gate electrodes. The insulating film 11 is preferably formed not by the plasma CVD method, but by the thermal CVD method or coating method. Such an insulating film 11 is the $O_3$-TEOS oxide film (ozone film) or the SOG film. The SOG film in use can be, for example, a polysilazane-based SOG film. The SOG film is subjected to annealing treatment at a temperature of 400 to 500° C. after coating. The polysilazane-based SOG film is subjected to the annealing treatment in an oxidation atmosphere so as to oxidize a nitrogen (N) component. The $O_3$-TEOS oxide film is a silicon oxide film formed by the thermal CVD method using ozone ($O_3$) and tetraethoxysilane (TEOS) as raw material gas (source gas). The temperature of the semiconductor substrate in forming the film is set to about 400 to 500° C.

As described above, in the semiconductor device of this embodiment, the nickel silicide layer is formed as the metal silicide layer 9. Thus, the semiconductor device is restricted by the heat resistance (of about 500° C.) of the nickel silicide layer. Thus, in forming the insulating film 11 by the thermal CVD method, the temperature of film formation needs to be equal to or less than 500° C. In forming the insulating film 11 by the coating method, the annealing temperature after the coating needs to be equal or less than 500° C.

Figure 6:
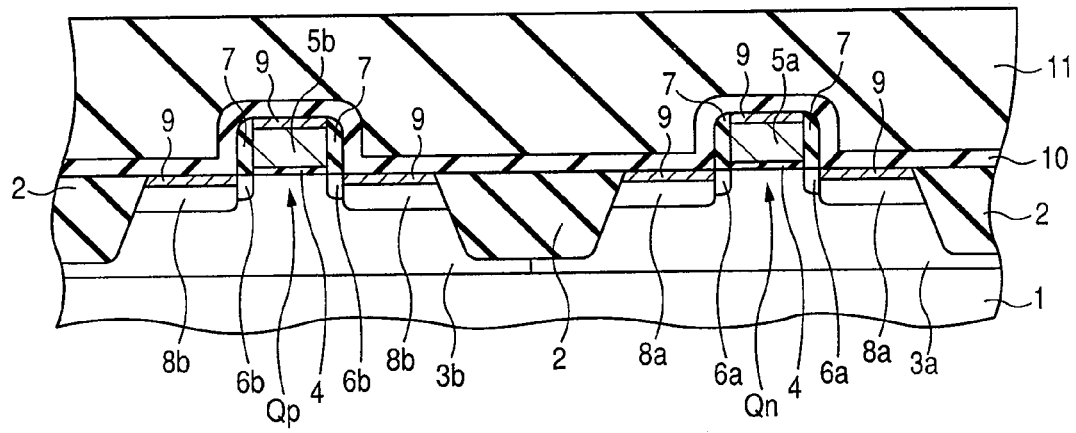
FIG. 6 is a sectional view showing another step performed after the step shown in FIG. 5 in the first embodiment.

Then, as shown in FIG. 6, the insulating film 11 is subjected to a polishing process using a chemical mechanical polishing (CMP) method to planarize the upper surface of the insulating film 11. When the sufficient flatness of the insulating film 11 is already ensured in the stage of formation of the insulating film 11, the planarization process may be omitted.

Figure 7:
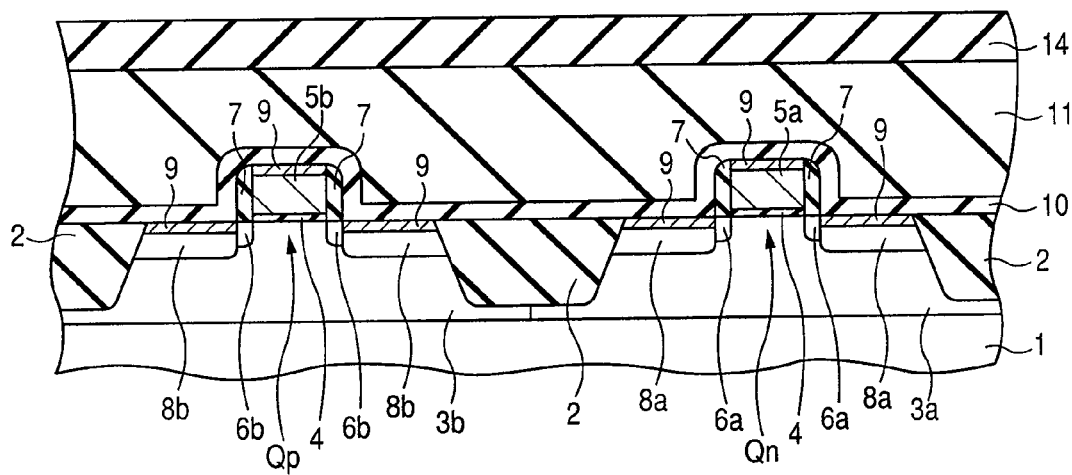
FIG. 7 is a sectional view showing another step performed after the step shown in FIG. 6 in the first embodiment.

Then, as shown in FIG. 7, the insulating film (second interlayer insulating film) 14 is formed over the insulating film 11. As described above, the insulating film 11 in use is not an insulating film formed by the plasma CVD method, but an insulating film having a relatively high embedded property and formed by the thermal CVD method or the coating method. The insulating film with the high embedded property, however, has the low density as a film, the small number density of silicon (Si) atoms, and the high hygroscopic property, as compared to the insulating film formed by the plasma CVD method.

In comparison between the film-forming methods using the same material, for example, a silicon oxide film formed by the thermal CVD method using the $O_3$-TEOS or the like as the raw material gas, or a silicon oxide film formed by laminating the SOG by the coating method has the low density as the film, and the small number density of silicon (Si) atoms, as compared to a silicon oxide film formed by the plasma CVD method using the TEOS or the like as raw material gas.

This is because the insulating film formed by the thermal CVD method or the coating method has a high density of moisture or OH group contained as compared to the insulating film formed by the plasma CVD method. In particular, regardless of material used, the insulating film formed by the thermal CVD method or the coating method has the high density of moisture and OH group contained, as compared to the insulating film formed by the plasma CVD method. This relationship is also satisfied between the $O_3$-TEOS film formed by the thermal CVD method, the SOG film formed by the coating method, and the following comparison films which include a low-k insulating film formed by the plasma CVD method to be described later, a low-dielectric constant insulating film comprised of low-dielectric constant material, such as a low-k material, a silicon oxide film, a silicon oxide nitride film, a film made of a silicon nitride-based material, and a film made of a silicon carbide-based material. Thus, the insulating film 14 absorbs moisture in the stage of film formation, and tends to have a high content of moisture.

After forming the insulating film 11, the annealing process may be applied to the insulating film 11 at a high temperature of 800° C. or more, so that the insulating film 11 may become dense to have the large number density of Si atoms, and thus does not tend to absorb moisture. However, the annealing process cannot be performed due to the restriction in heat resistance (of about 500° C.) of the nickel silicide layer forming the metal silicide layer 9. For this reason, when a film having the low humidity resistance is formed on the insulating film 11 so as to be brought into contact with the insulating film 11, the interface between the film and the insulating film 11 becomes electrically weak, and thus acts as a dielectric breakdown route, which can reduce resistance to the dielectric breakdown.

Accordingly, in the semiconductor device of this embodiment, the insulating film 14 is formed preferably by the plasma CVD method so as to have excellent electric properties and humidity resistance. The insulating film 14 is an insulating film containing silicon (Si) and oxygen (O) as components, preferably, silicon (Si) and oxygen (O) as principal components, and more preferably, a silicon oxide ($SiO_x$) film, or a silicon oxide nitride (SiON) film (or a silicon oxynitride film).

The silicon oxide nitride (SiON) film is an insulating film containing silicon (Si) and oxygen (O) as principal components, and to which nitrogen (N) is introduced (added). The composition ratio of oxygen (O) to silicon (Si) in the insulating film 14, that is, the ratio of the number of atoms of oxygen (O) to that of silicon (Si) (O atom number/Si atom number) is preferably equal to or more than 1.5. In this case, the insulating film 14 has the ratio of the oxygen (O) content to the silicon (Si) content of 1.5 or more in terms of the ratio of the number of atoms. When the composition of the insulating film 14 is represented by "$SiO_x$" or "$SiO_xN_y$", the reference character X of the $SiO_x$ or $SiO_xN_y$ is equal to or more than 1.5 ($X \geq 1.5$).

In the case of using the silicon oxide ($SiO_x$) film not containing nitrogen (N) as the insulating film 14, a dielectric constant of the insulating film 14 can be decreased, and thus a parasitic capacity between the wirings 20 can also be decreased as will be described later. In the case of using the silicon oxide nitride (SiON) film containing silicon (Si), oxygen (O), and nitrogen (N) as the insulating film 14, the composition ratio of nitrogen (N) to silicon (Si) in the insulating film 14, that is, the ratio of the number of atoms of nitrogen (N) to that of silicon (Si) (N atom number/Si atom number) is preferably equal to or less than 0.2.

In this case, the insulating film 14 has the ratio of the nitrogen (N) content to the silicon (Si) content of 20% or less in terms of the ratio of the number of atoms. When the composition of the insulating film 14 is represented by "$SiO_xN_y$", the reference character X of the $SiO_xN_y$ is equal to or more than 1.5 ($X \geq 1.5$), and Y thereof is equal to or less than 0.2 ($Y \leq 0.2$). The ratio of the number of atoms of nitrogen (N) to that of silicon (Si) (N atom number/Si atom number) in the insulating film 14 is set to 0.2 or less, which can decrease an increase in dielectric constant of the insulating film 14 caused by introduction of nitrogen (N), thereby reducing the parasitic capacity between the wirings 20 as will be described later. Further, the insulating film 14 may contain hydrogen (H).

The insulating film 14 in use may be comprised of silicon nitride (SiN) based material, and silicon carbide (SiC) based material. However, since the silicon nitride-based material has a high dielectric constant (for example, a relative dielectric constant k=about 7 to 8) and may enhance the parasitic capacity between the wirings, the silicon carbide (SiC) based material having a lower dielectric constant (for example, a relative dielectric constant k=about 3.5 to 5) may be preferably used.

The silicon carbide (SiC) based material preferably contains silicon (Si) and carbon (C) as principal components, but may include hydrogen (H), nitrogen (N), and/or oxygen (O) in addition to the silicon (Si) and carbon (C). Thus, the insulating film 14 in application can be a silicon carbide (SiC) film comprised of silicon (Si) and carbon (C), a silicon carbide-nitride (SiCN) film comprised of silicon (Si), carbon (C), and nitrogen (N), or an SiOC film (or a SiCO film, or a carbon-contained silicon oxide film) comprised of silicon (Si), carbon (C), and oxygen (O).

The SiCN film is an insulating film containing silicon (Si) and carbon (C) as principal components, and to which nitrogen (N) is introduced (added). The SiOC film is an insulating film containing silicon (Si) and carbon (C) as principal components, and to which oxygen (O) is introduced (added). In this way, the use of the silicon carbide (SiC) based material for the insulating film 14 can make the dielectric constant (relative dielectric constant) of the insulating film 14 lower than the dielectric constant (relative dielectric constant) of the silicon nitride film.

As mentioned above, the insulating film 14 formed by the plasma CVD method is inferior in embedded property into a small space as compared to the insulating film 11 formed by the thermal CVD method or the coating method, but is dense itself and has the large number density of atoms of the silicon (Si) in the film, thus resulting in low hygroscopic property and high humidity resistance. In the plasma CVD method, which is one of film formation methods in the plasma, moisture or OH group is effectively discharged during formation of the film, whereby an interlayer insulating film having good humidity resistance can be formed without absorbing the moisture or OH group in the film. In contrast, the thermal CVD method is inferior in the degree of discharge of the moisture or OH group to the plasma CVD method during the film formation, whereby some moisture or OH groups may be taken in the film itself formed by the thermal CVD method. Further, in the coating method, a heating and curing process is performed after rotating and applying a material solution or the like to the wafer thereby to form an insulating film, whereby a great amount of moisture or OH group may be taken in the film itself formed by the coating method.

The insulating film 14 is formed on the upper surface of the insulating film 11 planarized. The insulating film 14 having the lower hygroscopic property and the more excellent humidity resistance than the insulating film 11 can cover the insulating film 11 whose content of moisture tends to increase regardless of the embedded property. Thus, an interface between the insulating films 11 and 14 does not drastically become electrically weak. This embodiment can prevent formation of the dielectric breakdown route at the interface, and can improve the resistance to dielectric breakdown.

As mentioned above, in the semiconductor device of this embodiment, the insulating film 14 (second interlayer insulating film) has the number density of silicon (Si) atoms larger than that of the insulating film 11 (first interlayer insulating film). The number density of silicon (Si) atoms corresponds to the number of silicon (Si) atoms per unit volume. In other words, the insulating film 14 can have the number of silicon (Si) atoms per unit volume larger than that of the insulating film 11.

Like the insulating films 11 and 14, an insulating film containing silicon (Si) and oxygen (O) as principal components has the lower film density, and the higher hygroscopic property as the number density of silicon (Si) atoms becomes smaller. This relationship is satisfied when the ratio of the number of atoms of nitrogen (N) to that of silicon (Si) (N atom number/Si atom number) even of a silicon oxide nitride (SiON) film comprised of silicon (Si), oxygen (O), and nitrogen (N), as well as a silicon oxide ($SiO_x$) film comprised of silicon (Si) and oxygen (O) is equal to or less than 0.2.

The above-mentioned relationship is satisfied as long as the ratio of the number of atoms of nitrogen (N) to that of silicon (Si) (N atom number/Si atom number) in the silicon oxide nitride film is equal to or less than 0.2 even in comparison between the silicon oxide films, between the silicon oxide nitride films, or between the silicon oxide film and the silicon oxide nitride film.

Further, even when one or both of the insulating film 11 and the insulating film 14 contains a small amount of carbon (C), the above-mentioned relationship is satisfied. The term "small amount of carbon" as used in this case means that the ratio of the number of atoms of carbon (C) to that of silicon (Si) in the insulating film (C atom number/Si atom number) is equal to or less than 0.05. Thus, in the semiconductor device of this embodiment, the insulating film 14 has the larger number density of silicon (Si) atoms than that of the insulating film 11, and the lower hygroscopic property than that of the insulating film 11.

The insulating film containing silicon (Si) and oxygen (O) as principal components, like the insulating films 11 and 14, is apt to be etched by hydrofluoric acid (HF). Specifically, the smaller the number density of silicon (Si) atoms of the insulating film, the higher the etching rate by the hydrofluoric acid. Thus, the insulating film which contains silicon (Si) and oxygen (O) as principal components, and whose etching rate by the hydrofluoric acid is higher can be determined to have the smaller number density of silicon (Si) atoms, and the higher hygroscopic property.

Thus, by comparing etching rates by the hydrofluoric acid between the insulating films 11 and 14, it can be determined which one of the insulating films 11 and 14 is a film having the larger number density of silicon (Si) atoms and the lower hygroscopic property. In the semiconductor device of this embodiment, since the insulating film 14 has the larger number density of silicon (Si) atoms and the lower hygroscopic property than that of the insulating film 11, the etching rate of the insulating film 14 in etching by the hydrofluoric acid is smaller than that of the insulating film 11. That is, the silicon oxide film or silicon oxide nitride film (insulating film 14) formed by the plasma CVD method has the large number density of silicon (Si) atoms, the small etching rate by the hydrofluoric acid, and the low hygroscopic property, as compared to the $O_3$-TEOS oxide film formed by the thermal CVD method, or the SOG film (insulating film 11) formed by the spin-on glass method.

Figure 8:
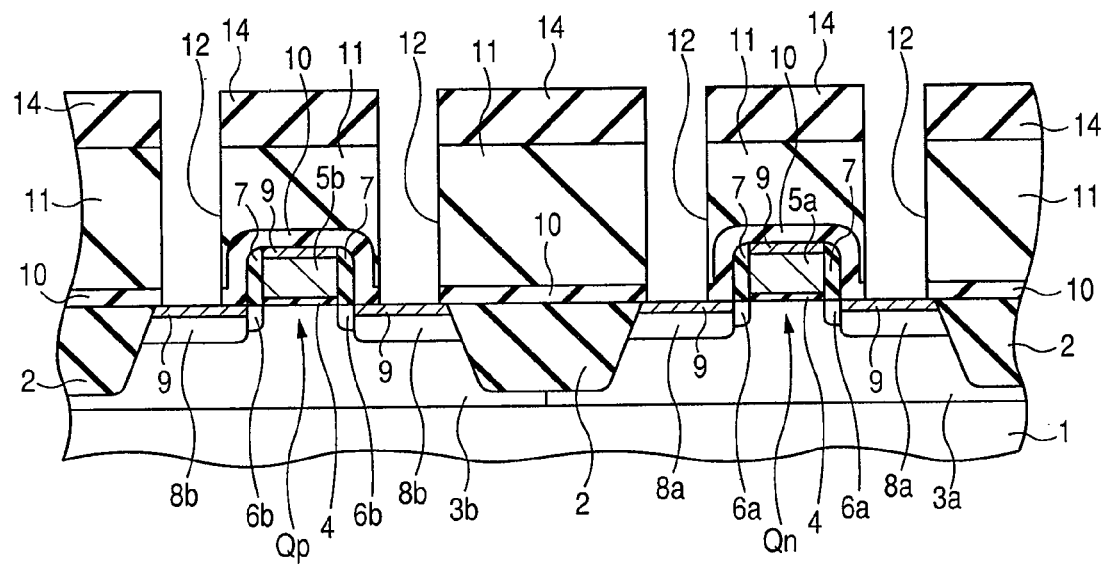
FIG. 8 is a sectional view showing another step performed after the step shown in FIG. 7 in the first embodiment.

Then, a predetermined photoresist pattern (not shown) is formed on the insulating film 14. The insulating films 14, 11, and 10 are dry-etched using the resist pattern as a mask to form contact holes 12 as shown in FIG. 8. The contact holes 12 are formed above the gate electrodes 5a and 5b, the $n^+$-type semiconductor region 8a, and the $p^+$-type semiconductor region 8b. Thus, a part of the $n^+$-type semiconductor region 8a, or a part of the $p^+$-type semiconductor region 8b is exposed to the bottom of the contact hole 12. Further, parts of the gate electrodes 5a and 5b are exposed (not shown).

In dry etching for forming the contact hole 12, the insulating film 14 and the insulating film 11 are etched in turn, while using the insulating film 10 as an etching stopper on an etching condition where an etching rate for the insulating films 14 and 11 is higher than that for the insulating film 10. Then, the insulating film 10 is etched on an etching condition where an etching rate for the insulating film 10 is higher than that for the insulating film 14, so that the contact holes 12 penetrating the insulating films 10, 11, and 14 are formed.

In etching the insulating film 11 so as to form the contact hole 12, the insulating film 10 serves as the etching stopper, thus preventing damage to a region of the semiconductor substrate 1 due to the etching, or deterioration of dimensional accuracy of the process. Thus, the insulating film 10 is preferably formed, but may not be formed if unnecessary.

Figure 9:
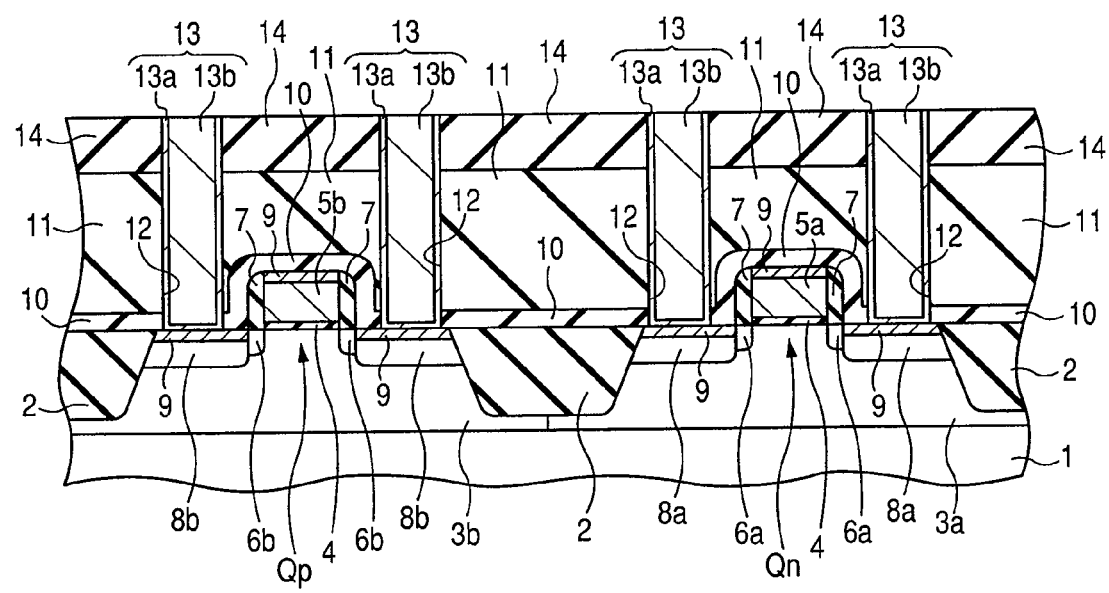
FIG. 9 is a sectional view showing another step performed after the step shown in FIG. 8 in the first embodiment.

Then, as shown in FIG. 9, the plug (first plug electrode) 13 comprised of a conductor, such as a tungsten (W) film or a copper (Cu) film, is formed in each contact hole 12. First, a conductive barrier film 13a is formed on the insulating film 11 containing the side walls and bottom of the contact hole 12. Then, a main conductive film 13b is formed on the conductive barrier film 13a so as to be embedded in the contact hole 12. The conductive barrier film 13a is comprised of, for example, a titanium film, a titanium nitride film, or a lamination of the above-mentioned films, and the main conductive film 13b is comprised of, for example, a tungsten (W) film, or a copper (Cu) film.

Then, the chemical mechanical polishing process or etching back process is applied to the wafer to remove a part of the conductive barrier film 13a and a part of the main conductive film 13b positioned above the upper surface of the insulating film 11, so that a part of the conductive barrier film 13a and a part of the main conductive film 13b in the contact holes 12 are each formed as the plug 13. Each plug 13 is comprised of, for example, the main conductive film 13b containing copper (Cu) or tungsten (W) as a principal component, and the conductive barrier film 13a, such as a titan film. In polishing the main conductive film 13b and the conductive barrier film 13a, the selectivity of polishing with respect to the insulating film 11 is poor in some cases. In this case, the upper surface of the insulating film 11 is also polished together with the conductive barrier film 13a or the like.

Figure 10:
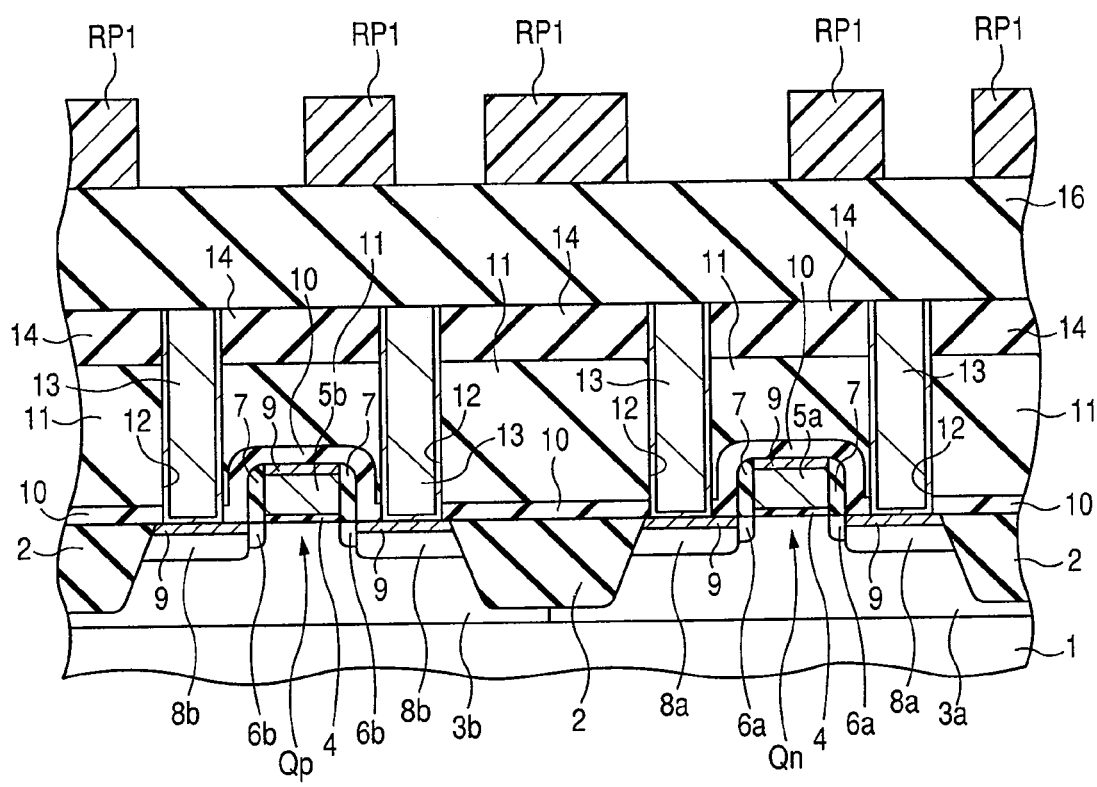
FIG. 10 is a sectional view showing another step performed after the step shown in FIG. 9 in the first embodiment.

Then, as shown in FIG. 10, the insulating film (third interlayer insulating film) 16 is formed on the insulating film 14 to cover the plugs 13. The insulating film 14 in use can serve to prevent the damage to a lower layer due to the etching, and the deterioration of dimensional accuracy of the process in forming a wiring trench or the like in the insulating film 16 by the etching. That is, in etching the insulating film 16, the insulating film 14 can serve as an etching stopper film. Thus, the insulating film 14 and the insulating film 16 are formed of materials having different etching rates. Accordingly, the insulating film 14 serves as the etching stopper for etching the insulating film 16, which can eliminate the necessary of provision of a new etching stopper between the insulating film 16 and the insulating film 14, thus achieving reduction in dielectric constant of the semiconductor device, and speed-up of the device.

In order to allow the insulating film 14 to serve as the etching stopper film, an etching selection ratio of an etching rate of the insulating film 16 to that of the insulating film 16 (etching rate of the insulating film 16/etching rate of the insulating film 14) may be preferably increased. For example, an insulating film whose etching selection ratio to that of the insulating film 14 is 3 or more is preferably used as the insulating film 16.

As mentioned above, the insulating film 14 may contain a silicon oxide (SiOx) film, a silicon oxide nitride (SiON) film, a silicon nitride (SiN) film, or a silicon carbide (SiC) based material, and further may contain a small amount of hydrogen (H). When the insulating film 14 is comprised of the above-mentioned insulating film or the like, the insulating film 16 whose material includes silicon (Si) and oxygen (O) as components can ensure the etching selection ratio with respect to the insulating film 14, and the insulating film 14 can sufficiently serve as the etching stopper film.

The composition ratio of carbon (C) to silicon (Si) in the insulating film 14, that is, the ratio of the number of atoms of carbon (C) to that of silicon (Si) (C atom number/Si atom number) is preferably equal to or more than 0.5, taking into consideration the function of the insulating film 14 as the etching stopper film, and the advantage of the silicon carbide-based (SiC) material having the lower dielectric constant (relative dielectric constant) than that of the silicon nitride film. In this case, the insulating film 14 has the ratio of the carbon (C) content to the silicon (Si) content of 0.5 or more in terms of the ratio of the number of atoms.

When the composition of the insulating film 14 which is the SiC film is represented as "$SiC_x$", or when the composition of the insulating film 14 which is the SiCN film is represented as "$SiC_xN_y$", or when the composition of the insulating film 14 which is the SiCO film is represented as "$SiC_xO_y$", the reference character X of $SiC_x$, $SiC_xN_y$ or $SiC_xO_y$ is equal to or more than 0.5 ($X \geq 0.5$).

The insulating film 16, which is the so-called "low-k insulating film" or an insulating film having the low dielectric constant and comprised of low-dielectric constant material, such as low-k material, is more preferable in use so as to enable a decrease in parasitic capacity between the adjacent wirings. For example, the low-dielectric constant insulating film (low-k insulating film) can be exemplified as an insulating film having the lower dielectric constant than that of the silicon oxide film (for example, the TEOS oxide film) contained in the passivation film. In general, studies have shown that the insulating film (insulating material) having the lower relative dielectric constant ($\in$=about 1.8 to 3.0) than the relative dielectric constant ($\in$=about 4.1 to 4.2) of the TEOS oxide film is referred to as the low-dielectric constant insulating film (low dielectric constant material).

The above-mentioned low-dielectric constant material may include an organic polymer material, and silica-based material. The organic polymer not containing Si as a principal component tends to be deformed. The use of the organic polymer has the disadvantage that stress tends to be concentrated on a group of wirings which are hardly deformed to cause the disconnection of the wirings. For this reason, the low-dielectric constant material in use is silica-based material containing silicon (Si) and oxygen (O) as principal components. The silica-based low-dielectric constant material may include, for example, Si—$CH_3$. The Si—$CH_3$ based material is generally referred to as "SiOC" or "OSG (organo silica glass)", and has a relative dielectric constant of about 2.1 to 3.3.

The silicon oxide fluoride (SiOF) film (or a fluorine-containing silicon oxide film) formed by the plasma CVD method may be used, and has a relative dielectric constant of 3.5 to 3.9. The SiOC, OSG, and SiOF which are low dielectric constant material can easily achieve etching selectivity among the silicon oxide (SiOx) film, the silicon oxide nitride (SiON) film, the silicon nitride (SiN) film, and the silicon carbide (SiC) film each of which is material for the insulating film 14, whereby the ratio of etching selectivity (etching rate of the insulating film 16/that of the insulating film 14) can be equal to or more than 3. The term "etching selectivity" as used herein means etching selectivity in forming wiring trenches or the like in the insulating film 16 by etching.

A film formation method will be described below. The Si—$CH_3$ based material can be used to form a film not only by a rotational coating method, but also the plasma CVD method. However, in forming the insulating film 16 by the rotation coating method, a solution is applied over a substrate while being rotated, and then a heat curing process is performed to allow the insulating film 16 to absorb a great amount of moisture, so that a dielectric breakdown route due to the moisture may be formed at an interface between the insulating film 14 and the insulating film 16. In order to prevent this phenomenon, in the invention, the insulating film 16 is formed by the plasma CVD method.

In forming the insulating film by the plasma CVD method, principal components of raw material gas include a component containing Si—$CH_3$, (TMS (trimethyl silane), TMCTS (tegramethyl cyclo tetrasiloxanes), and the like), and an oxidizing agent ($O_2$, $CO_2$ or the like). The components of the raw material gas are reacted at a temperature of the substrate of 350 to 400° C. to form a low-dielectric constant insulating film.

The insulating film 16 is an insulating film containing silicon (Si) and oxygen (O), and may further contain carbon (C), hydrogen (H), and/or fluorine (F) in addition to the silicon (Si) and the oxygen (O). Thus, the insulating film 16 is an insulating film containing silicon (Si) and oxygen (O), preferably, containing silicon (Si) and oxygen (O) as principal components, and more preferably a silicon oxide film or a low-dielectric constant insulating film having a dielectric constant lower than that of the silicon oxide film. As mentioned above, a silica-based low-dielectric constant material containing silicon (Si) and oxygen (O) as principal components are preferably used in the low-dielectric constant insulating film as the insulating film 16.

The insulating film 16 has the composition ratio of oxygen (O) to that of silicon (Si), that is, preferably, the ratio of the number of atoms of oxygen (O) to that of silicon (Si) (O atom number/Si atom number) of 1.0 or more. In this case, the insulating film 16 has the ratio of the oxygen (O) content to the silicon (Si) content of 1.0 or more in terms of the ratio of the number of atoms, and the insulating film 16 has the oxygen (O) content equal to or more than the silicon (Si) content thereof. When the composition of the insulating film 16 is represented by "$SiO_xC_y$" (which corresponds to a case of the insulating film 16 formed of a silica-based low-dielectric constant material film containing carbon), the reference character X of the $SiO_xC_y$ is equal to or more than 1.0 ($X \geqq 1.0$). The reference character Y of the $SiO_xC_y$ is preferably equal to or more than 0.5 ($X \geqq 0.5$) so as to make a relative dielectric constant equal to or less than, for example, 3.3.

When the silicon oxide ($SiO_x$) film is used as the insulating film 14 and the material for the insulating film 16 contains silicon (Si) and oxygen (O) as principal components, the insulating film 14 does not contain nitrogen (N) and carbon (C), and may not often achieve a sufficient etching selectivity ratio to serve as an etching stopper in relation to the etching of the insulating film 16.

Thus, the material for the insulating film 16 may be any other low-dielectric constant insulating film made of low-dielectric constant material (low-k insulating film, or a low-k material), and thus can achieve the ratio of a high etching selectivity with respect to the insulating film 14, and reduce the parasitic capacity between the adjacent wirings. In the semiconductor device of this embodiment, the silicon oxide ($SiO_x$) film is used as the insulating film 14, and the low-dielectric constant insulating film comprised of low-dielectric constant material is used as the insulating film 16.

Figure 11:
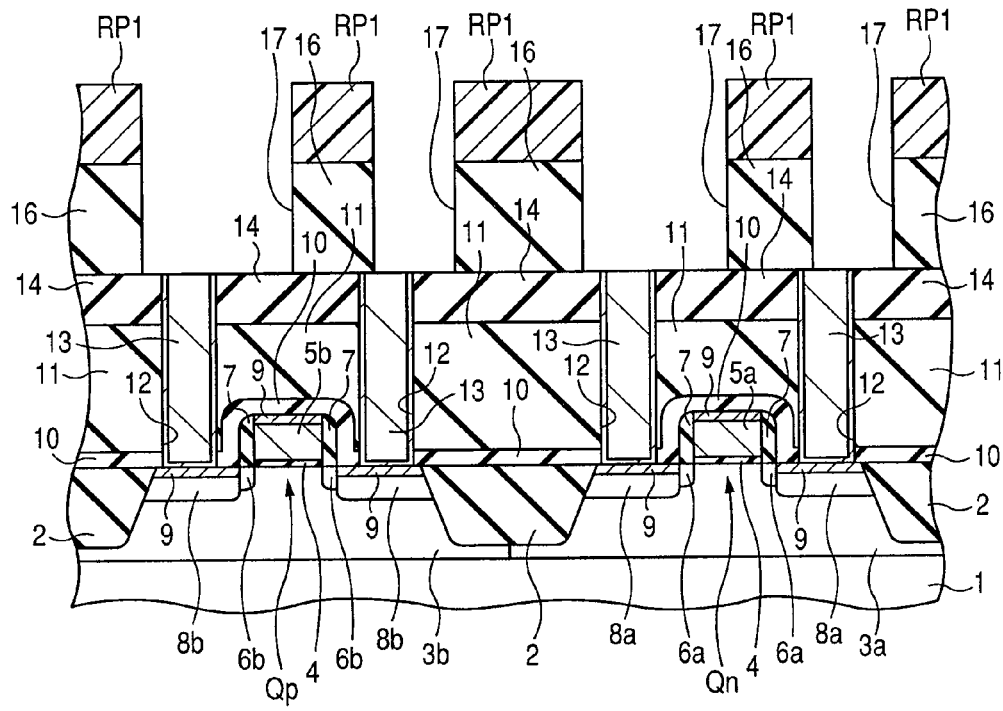
FIG. 11 is a sectional view showing another step performed after the step shown in FIG. 10 in the first embodiment.
Figure 12:
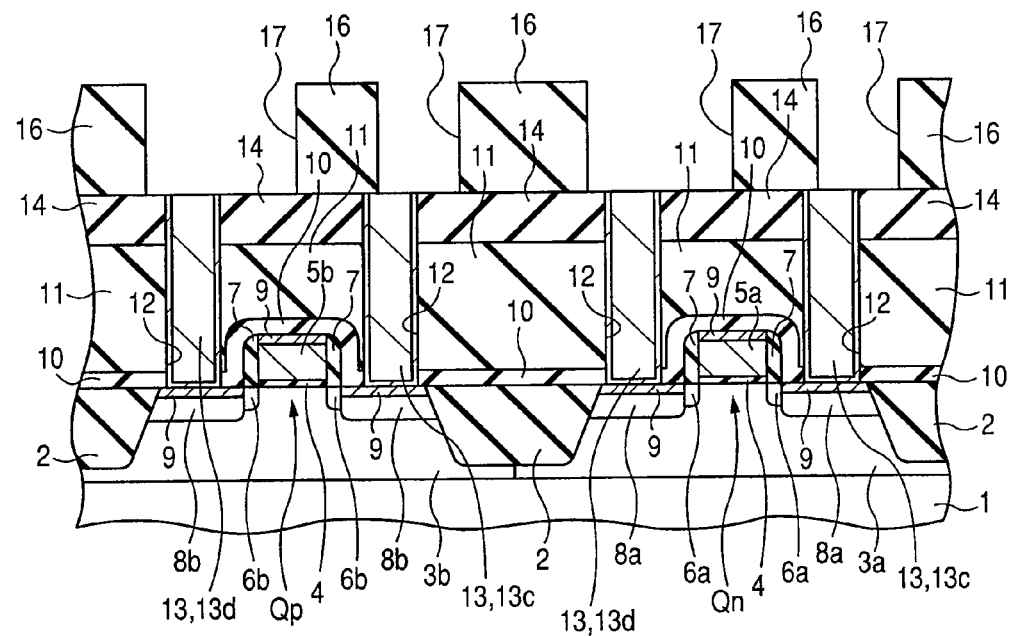
FIG. 12 is a sectional view showing another step performed after the step shown in FIG. 11 in the first embodiment.

Then, as shown in FIG. 10, a predetermined resist pattern RP1 is formed on the insulating film 16 by a photolithography method. Then, as shown in FIG. 11, the insulating film 16 is selectively removed by dry etching using the resist pattern RP1 thereby to form openings 17. At this time, the insulating film 16 is etched under an etching condition where the insulating film 16 is dry-etched more easily than the insulating film 14, while the insulating film 14 located as the lower layer can act as an etching stopper film. The insulating film 14 and the upper surface of the plug 13 are exposed to the bottom of the opening 14. Thereafter, as shown in FIG. 12, the part of the resist pattern RP1 is removed.

The openings 17 are formed in the insulating film 16 so as to allow the entire upper surfaces of the plugs 13 to be exposed to the bottoms of the openings 17 from the viewpoint of design. However, actually, the opening 17 can be displaced from the plug 13 due to an error of alignment by photolithography (resist pattern RP1). In order to expose the entire upper surface of the plug 13 to the bottom of the opening 17 even with the displacement, the dimension of the opening 17 may be previously designed to be large, taking into consideration the amount of displacement, which may lead to an increase in chip size of the semiconductor device.

In general, the opening 17 is allowed to overhang outward as viewed in the planar direction without exposing a part of the upper surface of the plug 13 to the inside of the opening 17 as long as a sufficient contact area for electrical connection is obtained. In the step shown in FIG. 12, among the plugs 13, a plug 13d has the entire upper surface thereof exposed to the bottom of the opening 17, while a plug 13c has only a part of the upper surface thereof exposed to the bottom of the opening 17.

Figure 13:
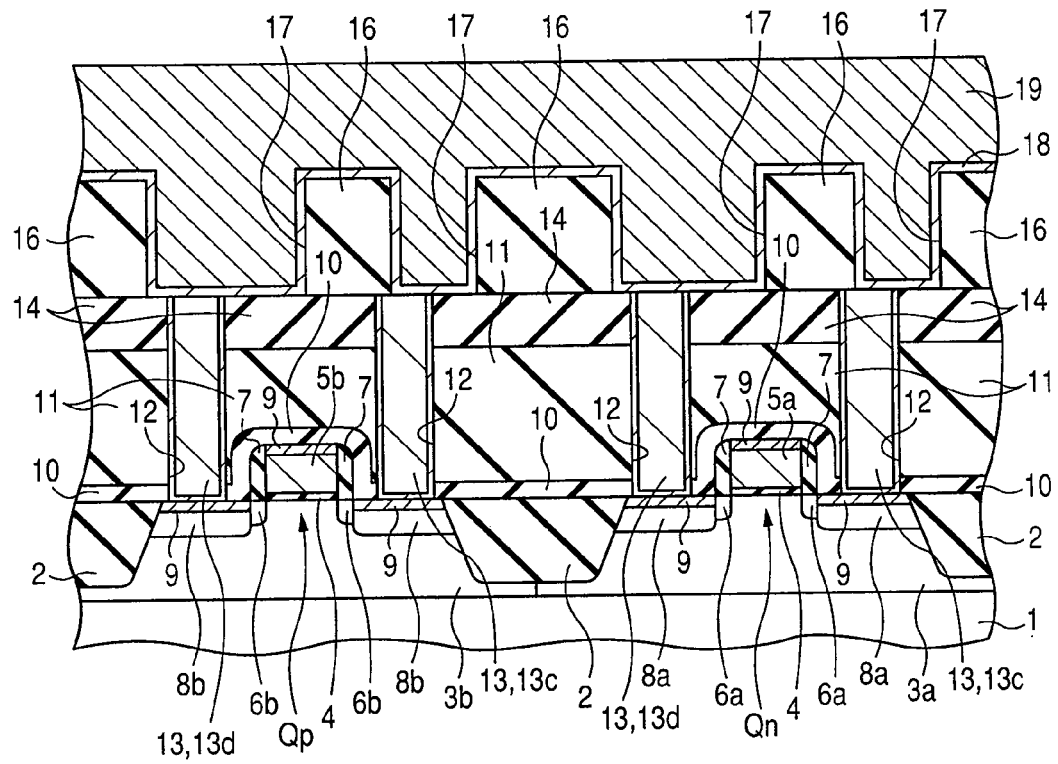
FIG. 13 is a sectional view showing another step performed after the step shown in FIG. 12 in the first embodiment.

Then, as shown in FIG. 13, a relatively thin conductive barrier film 18 of about 50 nm in thickness, for example, formed of a tantalum (Ta) film, a nitride tantalum (TaN) film, or a lamination of these films, is formed on the insulating film 16 containing the bottom and side walls of the opening 17. The conductive barrier film 18 is formed by the sputtering method or CVD method. The conductive barrier film 18 has a function of reducing or preventing diffusion of copper of the main conductive film 19 to be described later, and a function of improving contact between the main conductive film 19 and insulating films (insulating films 14 to 16).

Material for such a conductive barrier film 18 can be in use a high melting point metal nitride or the like, such as tungsten nitride (WN) or titanium nitride (TiN), which hardly reacts with copper, instead of the above-mentioned tantalum-based material. Alternatively, material for the conductive barrier film 18 can be in use a material produced by adding silicon (Si) to a high melting point metal nitride, or a high melting point metal, such as titanium (Ti), tungsten (W), titanium-tungsten (TiW) alloy, or ruthenium (Ru), which does not tend to react with copper. The conductive barrier film 18 in use may be not only a single film comprised of the above-mentioned material, but also a lamination of the above-mentioned materials.

Then, a main conductive film 19 comprised of copper and having a relatively large thickness as compared to the conductive barrier film 18 is formed on the conductive barrier film 18, for example, in a thickness of about 800 to 3600 nm so as to fill the openings 17 therewith. The main conductive film 19 is formed, for example, by sputtering, plating, and the like. The main conductive film 19 can be formed of a conductive film containing copper as a principal component, for example, copper or copper alloy (which contains Cu as a principal component, and also for example, Mg, Ag, Pd, Ti, Ta, Al, Nb, Zr, or Zn).

Alternatively, a relatively thin seed film comprised of copper (or copper alloy) is formed on the conductive barrier film 18 by the sputtering method or the like, and a relatively thick main conductive film 19 can be formed of copper (or copper alloy) on the seed film by plating or the like. Thereafter, the thermal treatment is applied to the semiconductor substrate 1, for example, in a non-oxidizing atmosphere (for example, in a hydrogen atmosphere) to grow crystal grains of the main conductive film 19.

Figure 14:
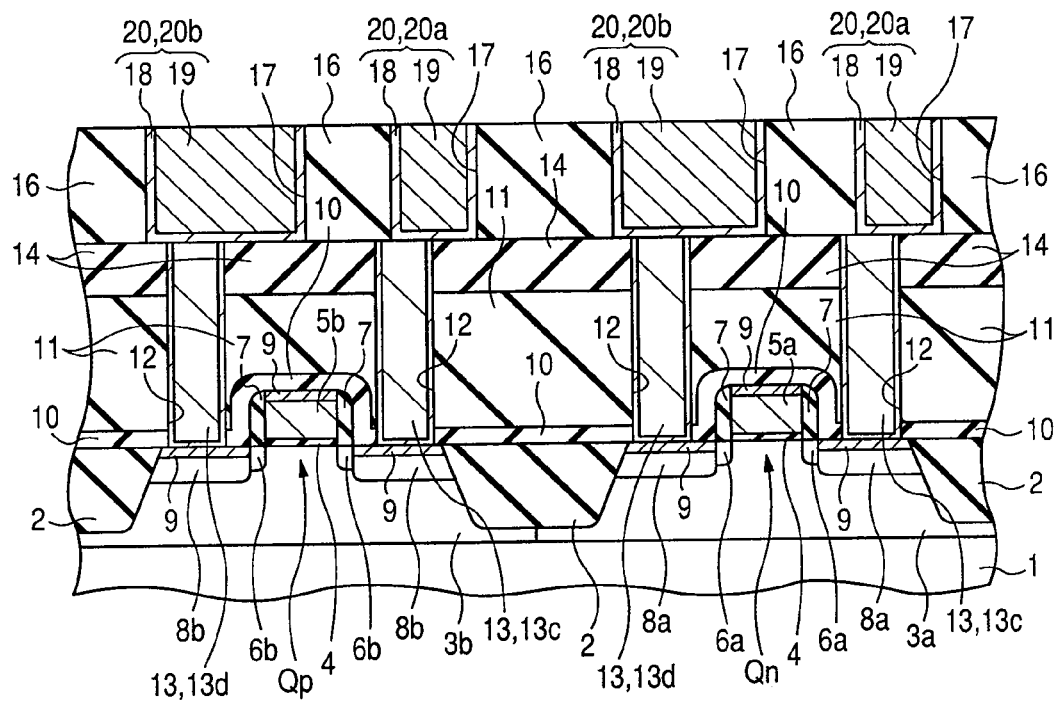
FIG. 14 is a sectional view showing another step performed after the step shown in FIG. 13 in the first embodiment.

Then, as shown in FIG. 14, the main conductive film 19 and the conductive barrier film 18 are polished by the chemical mechanical polishing process until the upper surface of the insulating film 16 is exposed. The parts of the conductive barrier film 18 and the main conductive film 19 located on the upper surface of the insulating film 16 are removed to leave the conductive barrier film 18 and the main conductive film 19 in the openings 17, whereby the wirings 20 are formed in the openings 17. Each wiring 20 includes the relatively thin conductive barrier film 18 and the relatively thick main conductive film 19.

The wiring 20 is a wiring (embedded wiring) embedded in the opening 17 formed in the insulating film 16, and a part of the bottom of the wiring 20 is in contact with the upper surface of the plug 13 to allow the wiring 20 to be electrically coupled to the plug 13. Thus, the wiring 20 is electrically coupled to the $n^+$-type semiconductor regions (source, and drain) 8a, the $p^+$-type semiconductor regions (source, and drain) 8b, or the gate electrode 5a, 5b via the plug 13. For example, the unnecessary parts of the conductive barrier film 18 and the main conductive film 19 may be removed, for example, by etching, such as a charge etching, in addition to the chemical mechanical polishing method.

In the semiconductor device of this embodiment, as mentioned above in the step shown in FIG. 12, the positional displacement between the opening 17 and the plug 13 is allowed, and at least a part of the upper surface of the plug 13 may be exposed to the opening 17 to be in contact with the wiring 20. Thus, among the plugs 13, the entire upper surface of the plug 13d is in contact with the wiring 20, but only a part of the upper surface of the plug 13c is in contact with the wiring 20 and other parts of the upper surface thereof are covered with the insulating film 16. That is, the part of the upper surface of the plug 13c is in contact with the wiring 20, but the remaining part of the upper surface of the plug 13c is covered with the insulating film 16.

In such a case, a distance between the plug 13c and a wiring 20b adjacent to a wiring 20a coupled to the plug 13c is shorter than the smallest distance between the adjacent wirings 20 (the distance between the wiring 20a and the wiring 20b), which may easily cause dielectric breakdown between the plug 13c and the wiring 20c which are close to each other, especially, at an interface between the insulating film 14 and the insulating film 16.

The inventors have confirmed through the studies by experiments that the dielectric breakdown is caused due to moisture at the interface between the insulating film 14 and the insulating film 16. In the semiconductor device of this embodiment, the insulating film 14 which the moisture hardly penetrates is laminated on the insulating film 11 which absorbs and contains a relatively great amount of moisture, so that the interface between the insulating films 14 and 16 serves to remove the moisture therefrom. Thus, it is confirmed that the formation of the weak dielectric breakdown route can be prevented at the interface between the insulating films 14 and 16. Even when the plug 13c gets close to the wiring 20b, the dielectric breakdown between the plug 13c and the wiring 20b can be prevented. The insulating films 14 and 16 are formed by the plasma CVD method which makes it difficult to absorb moisture in a manufacturing procedure, thereby preventing the dielectric breakdown route from being formed at the interface between the insulating films 14 and 16 due to the moisture.

Then, the semiconductor substrate 1 is disposed in a processing chamber of the plasma CVD device. Ammonia gas is introduced into the processing chamber of the plasma CVD device, and the power is applied from a plasma power supply to apply an ammonia ($NH_3$) plasma process to the semiconductor substrate 1. Alternatively, nitrogen ($N_2$) gas and hydrogen ($H_2$) gas may be introduced into the chamber to perform an $N_2/H_2$ plasma process. Such a reducing plasma process is performed to reduce copper oxide ($CuO$, $Cu_2O$, $CuO_2$) on the surface of the wiring 20 oxidized by the chemical mechanical polishing process to copper (Cu), and to form a thin region of a copper nitride (CuN) layer over the surface of the wiring 20.

Figure 15:
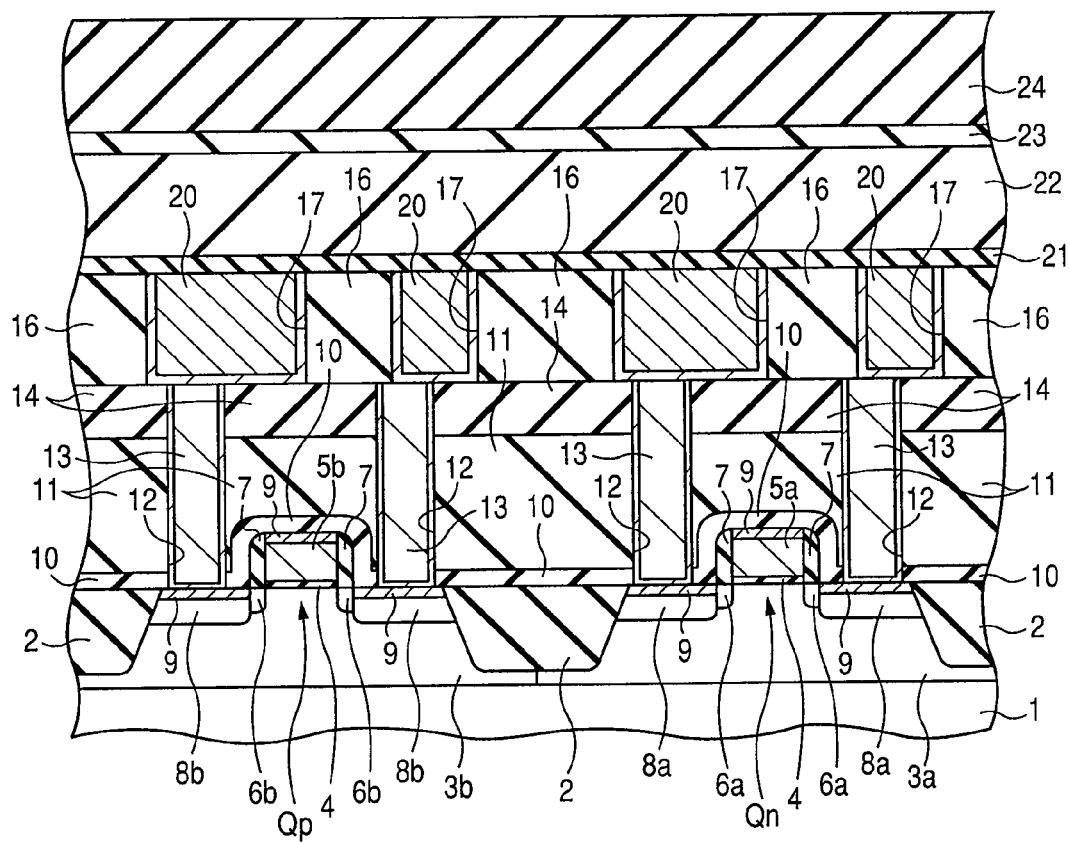
FIG. 15 is a sectional view showing another step performed after the step shown in FIG. 14 in the first embodiment.

Then, as shown in FIG. 15, an insulating film 21 is formed over the surface of the semiconductor substrate 1 so as to cover the wiring 20. The insulating film 21 serves as a barrier insulating film of the wiring 20 comprised of a copper wiring. Thus, the insulating film 21 suppresses or prevents the diffusion of copper of the main conductive film 19 of the wiring 20 into the insulating film 22 to be formed later. A material film having an excellent barrier property against copper is preferably used as the insulating film 21. For example, a silicon nitride (SiN) film, a silicon carbide (SiC) film, or a silicon carbide nitride (SiCN) film is preferably used. Such a film can be formed, for example, by the plasma CVD method.

Also, the silicon oxide nitride (SiON) film has the function of suppressing or preventing the diffusion of copper (Cu). Thus, not only the insulating film 22, but also the insulating film 16 containing silicon (Si), oxygen (O), and nitrogen (N) can have the function of suppressing or preventing the diffusion of copper (Cu). The formation of the dielectric breakdown route can be further suppressed or prevented at the interface between the insulating film 21 and the insulating film 16 between the adjacent wirings 20. Thus, the reliability of the wiring 20 can be further improved.

Then, an insulating film 22, an insulating film 23, and an insulating film 24 are formed over the insulating film 21 in that order. The insulating films 22 and 24 can be comprised of the same material as that of the insulating film 16. The insulating film 23 can be formed of the same material as that of the insulating film 14, as an etching stopper film.

Figure 16:
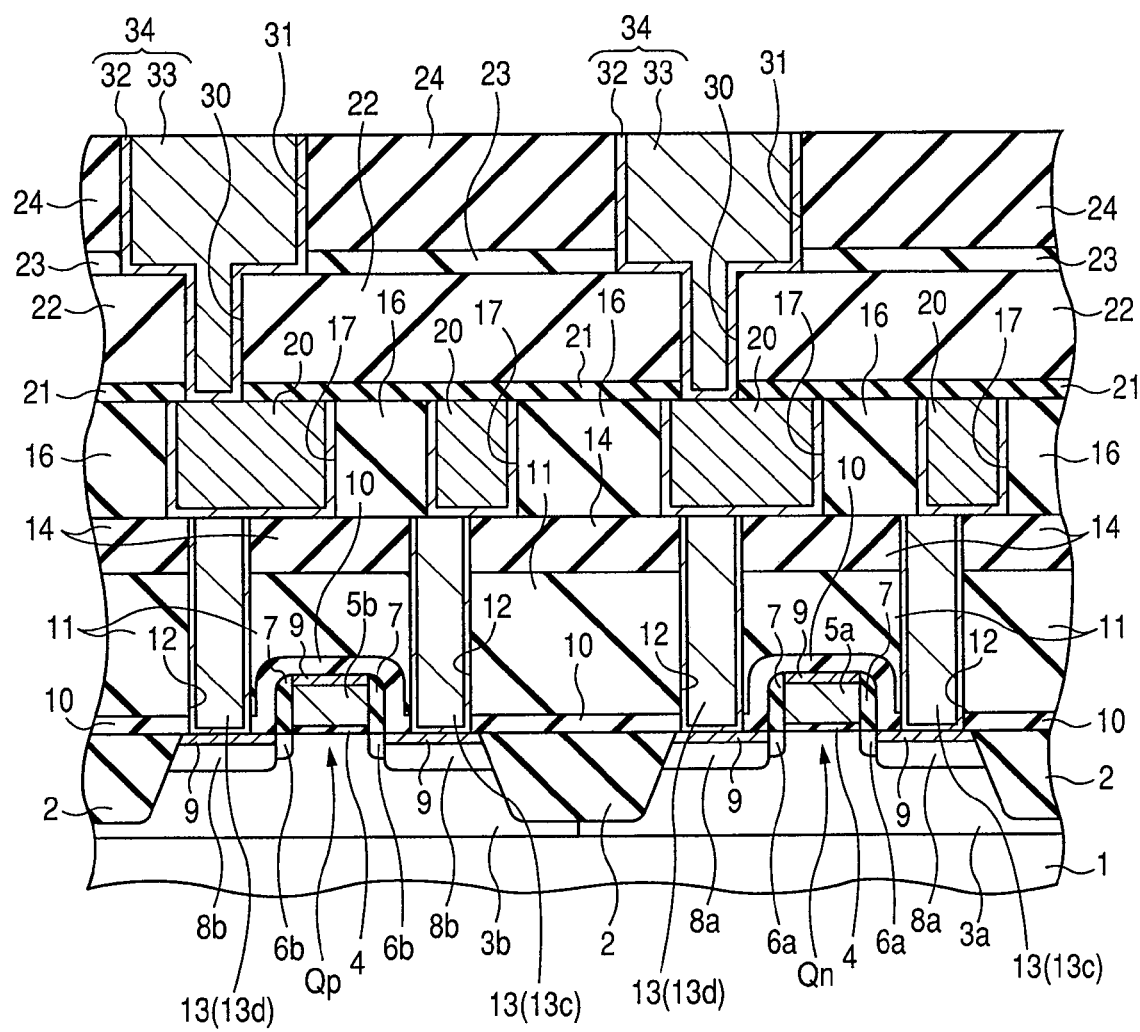
FIG. 16 is a sectional view showing another step performed after the step shown in FIG. 15 in the first embodiment.

Then, as shown in FIG. 16, openings (vias) 30 and openings (wiring trenches) 31 reaching the insulating films 21 to 24 and the wirings 20 are formed by the dry etching method or the like. The opening 31 is formed by selectively removing the insulating films 23 and 24. The opening 30 is formed by selectively removing the insulating films 21 and 22 at the bottom of the opening 31. The upper surface of the wiring 20 is exposed to the bottom of the opening 30. Then, a copper oxide formed on the surface of the wiring 20 exposed to the bottom of the opening 30 is removed. This is performed, for example, by reducing the copper oxide ($CuO$, $Cu_2O$, $CuO_2$) formed on the surface of the wiring 20 to copper (Cu) by the reducing plasma process, such as a hydrogen ($H_2$) plasma process.

Then, a thin conductive barrier film 32 comprised of the same material as that of the conductive barrier film 18 is formed on the insulating film 24 containing the bottoms and sides of the openings 30 and the openings 31. The conductive barrier film 32 has the same function as that of the conductive barrier film 18, for example, a function of suppressing or preventing the diffusion of copper of the main conductive film 33 to be described later, and a function of improving the contact between the main conductive film 33 and the insulating films 21 to 24. Then, the main conductive film 33 comprised of the same material as that of the main conductive film 19 is formed on the conductive barrier film 32 so as to fill the openings 30 and 31. Thereafter, the thermal treatment is applied to the semiconductor substrate 1, for example, in the non-oxidizing atmosphere (for example, hydrogen atmosphere) to grow crystal grains of the main conductive film 33.

Then, the upper surface of the insulating film 24 is exposed by applying a polishing process to the main conductive film 33 and the conductive barrier film 32 by the chemical mechanical polishing method. The parts of the conductive barrier film 32 and the main conductive film 33 located above the upper surface of the insulating film 24 are removed to leave the conductive barrier film 32 and the main conductive film 33 in the openings 30 and 31, whereby the wirings 34 are formed. The wiring 34 includes a wiring portion (wiring body) comprised of a part of the conductive barrier film 32 and a part of the main conductive film 33 located in the opening 31, and a via portion comprised of a part of the conductive barrier film 32 and a part of the main conductive film 33 located in the opening (via) 30. The wiring portion of the wiring 34 is electrically coupled to the wiring 20 via the via of the wiring 34. Thereafter, the same steps as those shown in FIGS. 15 and 16 are repeatedly performed if necessary, which can form a wiring layer as an upper layer. The description thereof will be omitted below. Thus, a main portion of the semiconductor device will be formed.

In the manufacturing method of the semiconductor device as described above, first, the insulating film 11 is formed by the thermal CVD method to cover the gate electrodes 5a and 5b of the MISFETs. The insulating film 14 is formed by the plasma CVD method on the insulating film 11 so as to cover the insulating film 11. Then, the plugs 13 are formed in the insulating film 11 and the insulating film 14. The insulating film 16 comprised of a low-dielectric constant material, such as a low-k film, is formed so as to cover the plugs 13. The wiring 20 electrically coupled to the plug 13 is formed in the insulating film 16.

Figure 17:
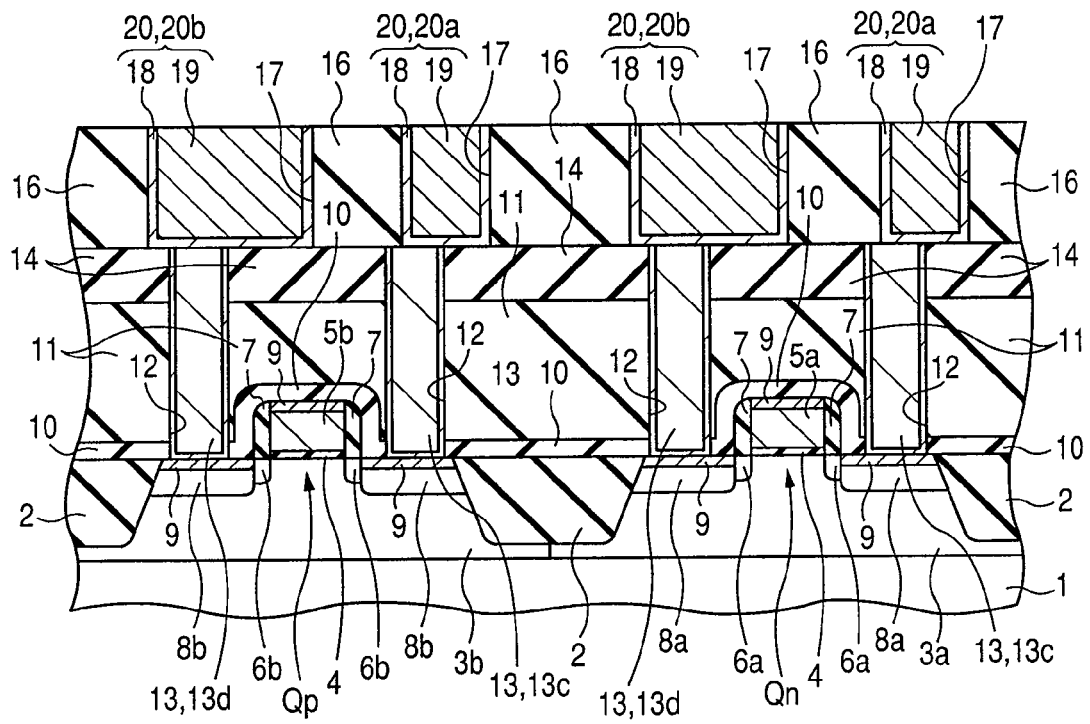
FIG. 17 is a sectional view for explaining the operation and effect of an insulating film in the first embodiment.

Thus, first, the insulating film 11 covering the gate electrodes 5a and 5b is formed by the thermal CVD method, so that the insulating film 11 is well embedded in a region between the adjacent gate electrodes 5a and 5b. The insulating film 11 whose hygroscopic property of moisture becomes high by being formed by the thermal CVD method is covered by the insulating film 14 whose humidity resistance becomes high by being formed by the plasma CVD method. Thus, as shown in FIG. 17, the moisture in the insulating film 11 is prevented from being diffused upward from the insulating film 11, so that the dielectric breakdown route can be prevented from being formed due to moisture at the interface between the insulating film 14 and the insulating film 16 where the bottom of the wiring 20 is in contact with the upper surface of the plug 13. As a result, the wirings 20 can be surely coupled electrically to the plugs 13, while ensuring insulation between the adjacent wirings 20, which can assure the reliability of the semiconductor device.

In etching the insulating film 16, the insulating film 14 is used as an etching stopper, which eliminates the necessity of provision of a new etching stopper between the insulating films 16 and 14. The insulating film 16 is comprised of low dielectric constant material, and thus can achieve speed-up of the operation of the semiconductor device. Since the insulating films 14 and 16 are formed by the plasma CVD method, moisture previously contained in the insulating films 14 and 16 is lessened during the manufacturing process, which can prevent the dielectric breakdown route from being formed due to the moisture at the interface between the insulating films 14 and 16.

Second Embodiment

Now, a semiconductor device which can improve the productivity (throughput) will be described below. The insulating film 11 covering the gate electrodes 5a and 5b as mentioned above is an insulating film having a good embedded property. The insulating film 11 is formed by the thermal CVD method. The thermal CVD method has a very slow coating velocity from a qualitative standpoint. Thus, after forming the insulating film 11 by the thermal CVD method only for embedding the insulating film in between the gate electrodes, an insulating film 14a is formed by the plasma CVD method whose film forming velocity is relatively high, which can improve the productivity of the semiconductor device.

The insulating film 14a formed by the plasma CVD method has higher hardness and higher resistance to scratch caused by the CMP process as compared to the insulating film 11 formed by the thermal CVD method. This embodiment does not apply the CMP process to the insulating film 11 formed by the thermal CVD method, and thus is superior from this point.

Figure 18:
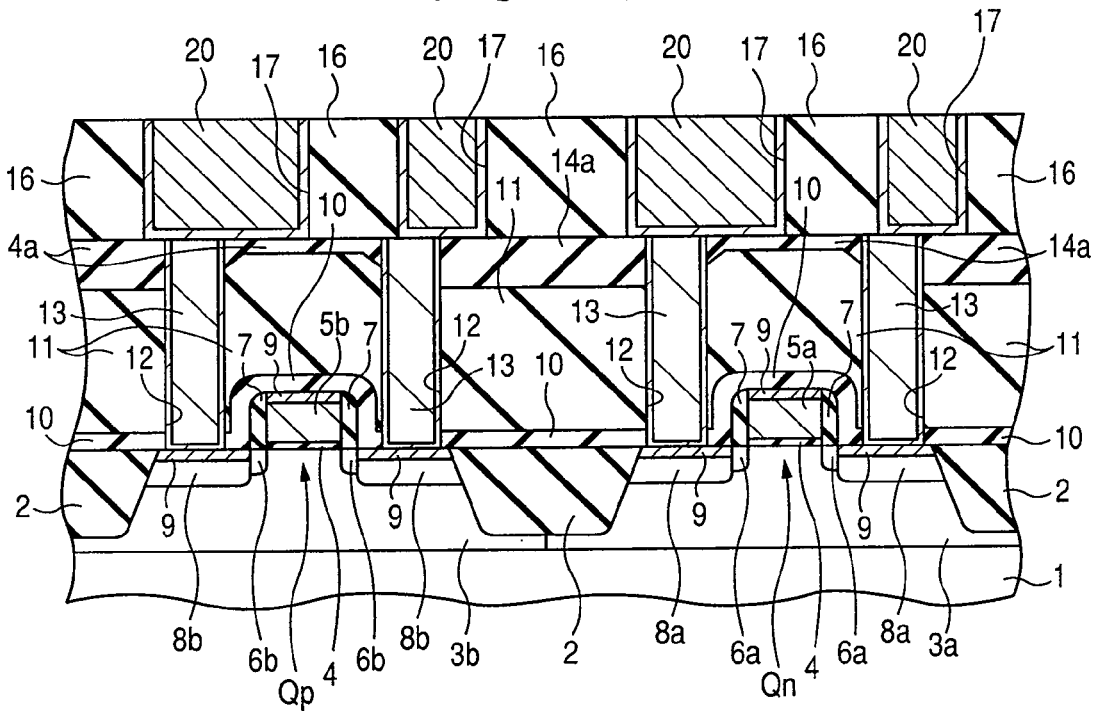
FIG. 18 is a sectional view showing a semiconductor device according to a second embodiment of the invention.

As shown in FIG. 18, in the semiconductor device according to this embodiment, the insulating film 11 is formed by the thermal CVD method only for embedding of the gate electrodes 5a and 5b, so that the parts of the insulating film 11 covering the gate electrodes 5a and 5b as an underlayer protrudes from the periphery. The insulating film 14a is formed by the plasma CVD method so as to cover the insulating film 11. Since the structures of other components are the same as those of the semiconductor device shown in FIG. 1, the same members are designated by the same reference numerals, and a description thereof will be described below.

Figure 19:
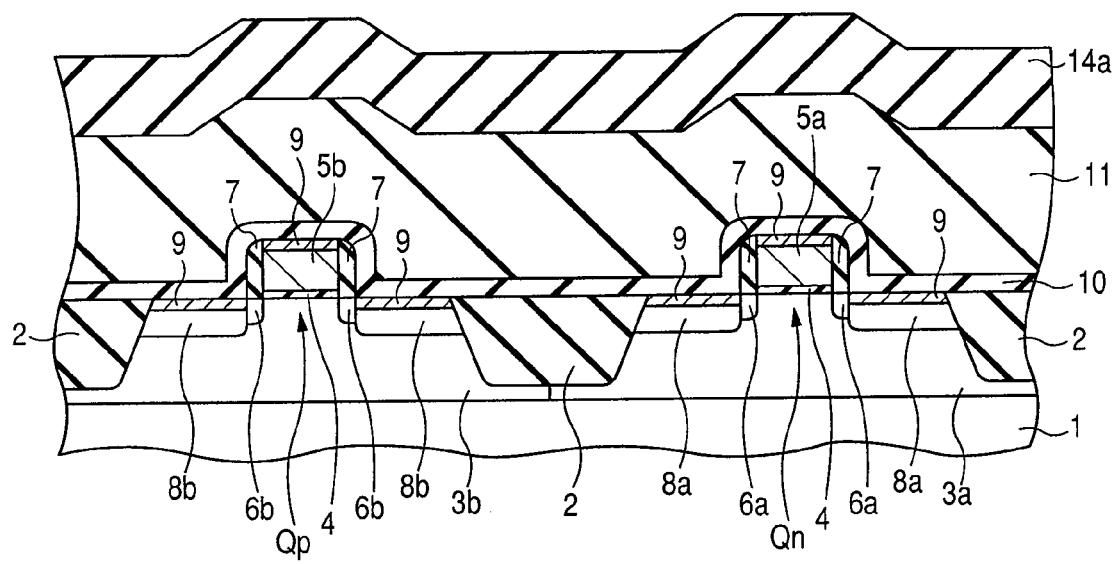
FIG. 19 is a sectional view showing one step in a manufacturing method of the semiconductor device according to the second embodiment.

Now, the manufacturing method of the semiconductor device as mentioned above will be described below. After the steps shown in FIGS. 1 to 4 as mentioned above, as shown in FIG. 19, the insulating film 11 is formed to be embedded in the space between the gate electrodes 5a and 5b by the thermal CVD method. In other words, the insulating film 11 is formed over the semiconductor substrate such that at least a region between the gate electrodes 5a and 5b is at a higher level than those of the gate electrodes 5a and 5b.

The insulating film 14a comprised of a silicon oxide film is formed by the plasma CVD method on the insulating film 11. The insulating film 11 is formed in the minimum thickness to fill in the space between the adjacent gate electrodes 5a and 5b. The insulating film 14a is formed on the insulating film 11 to ensure the planarization and the predetermined thickness.

Figure 20:
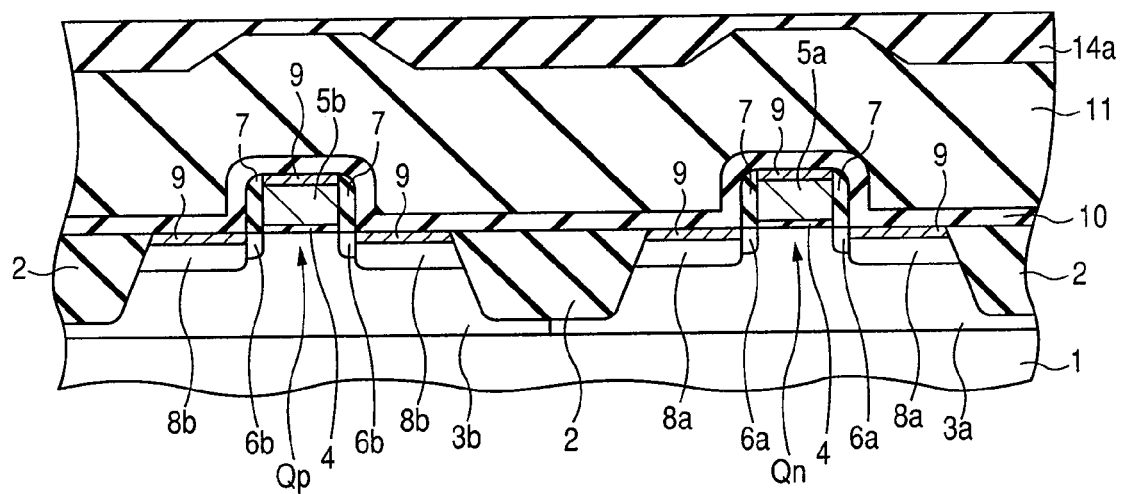
FIG. 20 is a sectional view showing another step performed after the step shown in FIG. 19 in the second embodiment.

Then, as shown in FIG. 20, the upper surface of the insulating film 14a is polished by the chemical mechanical polishing method to planarize the surface of the insulating film 14a. At this time, only the insulating film 14a is polished so as not to cause the surface of the insulating film 11 to be exposed. Thus, it is necessary to previously form the insulating film 14a in a sufficient thickness.

Figure 21:
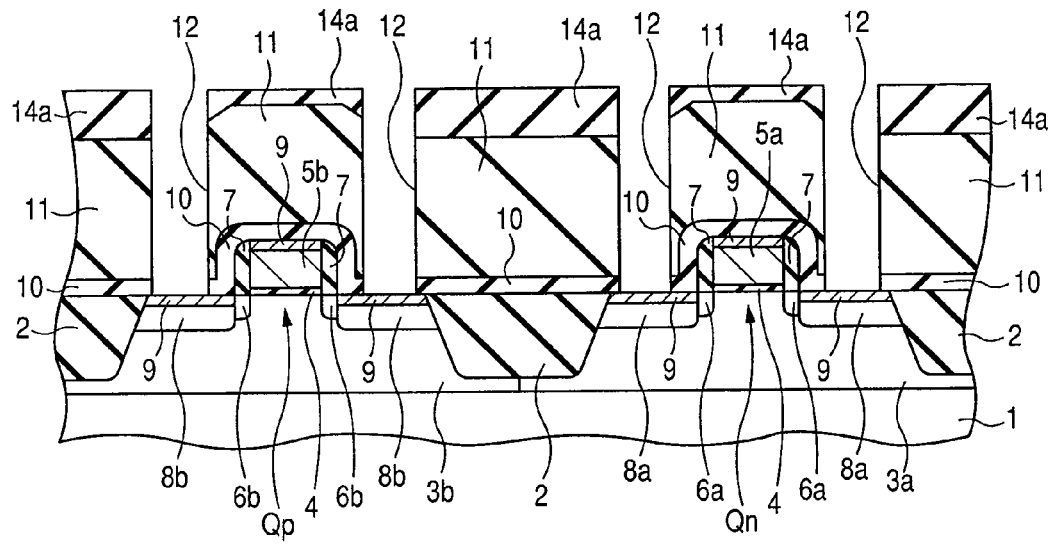
FIG. 21 is a sectional view showing another step performed after the step shown in FIG. 20 in the second embodiment.
Figure 22:
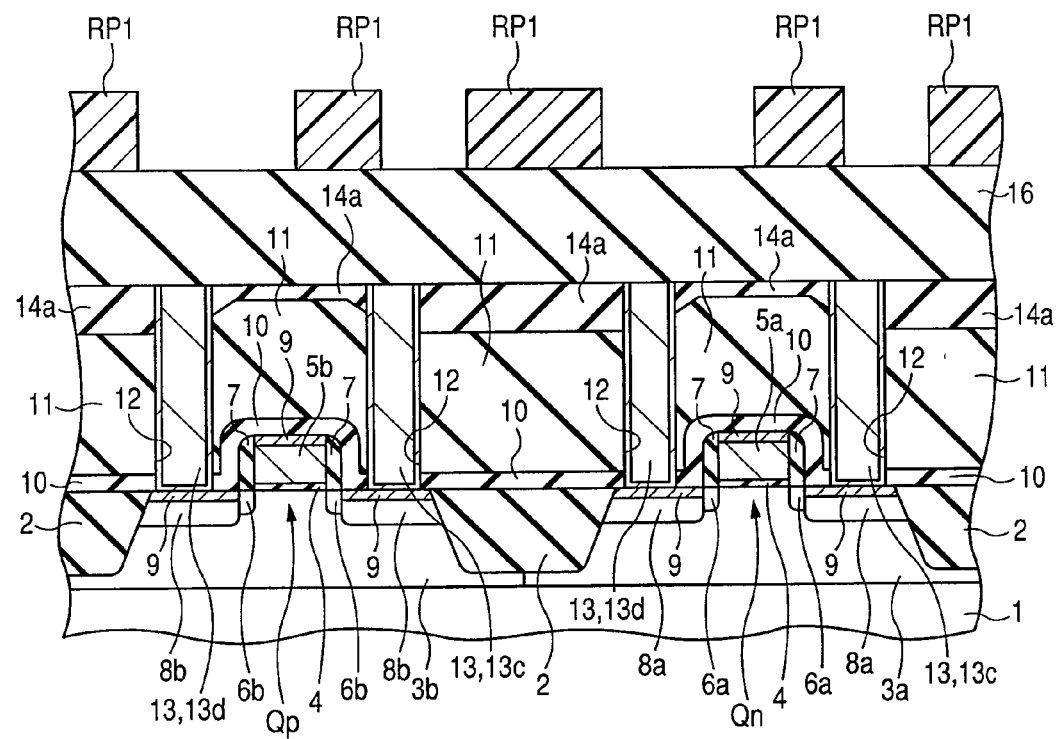
FIG. 22 is a sectional view showing another step performed after the step shown in FIG. 21 in the second embodiment.

Then, as shown in FIG. 21, contact holes 12 are formed in the insulating films 14a and 11 in the same way as the step shown in FIG. 8. Then, the plugs 13 are formed into the contact holes 12 in the same way as the step shown in FIG. 9 (see FIG. 22). Thereafter, the wirings or the like are formed through the same steps as the steps shown in FIGS. 10 to 14. As shown in FIG. 22, the insulating film 16 is formed on the insulating film 14a so as to cover the plug 13. The resist pattern RP1 is formed on the insulating film 16.

Figure 23:
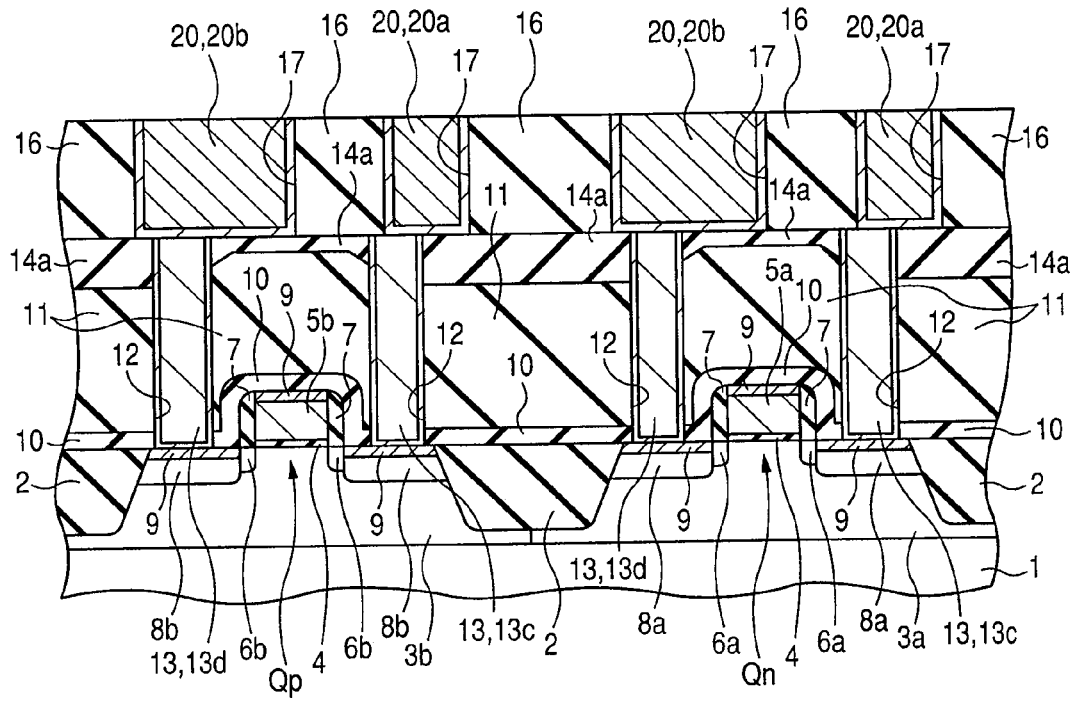
FIG. 23 is a sectional view showing another step performed after the step shown in FIG. 22 in the second embodiment.

The insulating film 16 is subjected to anisotropic etching using the resist pattern RP1 as a mask to form the openings 17 (see FIG. 23). At this time, as mentioned above, the insulating film 16 is etched using the insulating film 14a as an etching stopper to form the openings 17 in the insulating film 16. Then, as shown in FIG. 23, each wiring 20 is formed in the opening 17. Thereafter, the insulating films 22, 23, 24, the openings 30, 31, and the wiring 34 are formed in the same way as the steps shown in FIGS. 15 and 16 (see FIGS. 15 and 16).

According to the manufacturing method of the semiconductor device as described above, the following effects can be obtained in addition to the effect associated with the above-mentioned first embodiment. That is, the thermal CVD method whose film forming speed is relatively slow is performed to form the insulating film 11 having a minimum thickness required to be embedded in the space between the gate electrodes 5a and 5b, and the plasma CVD method whose film forming speed is relatively high is applied to the insulating film 11 to form the insulating film 14a, which can improve the productivity of the semiconductor device by increasing throughputs, as compared to the manufacturing method of the semiconductor device as described above.

Third Embodiment

Figure 24:
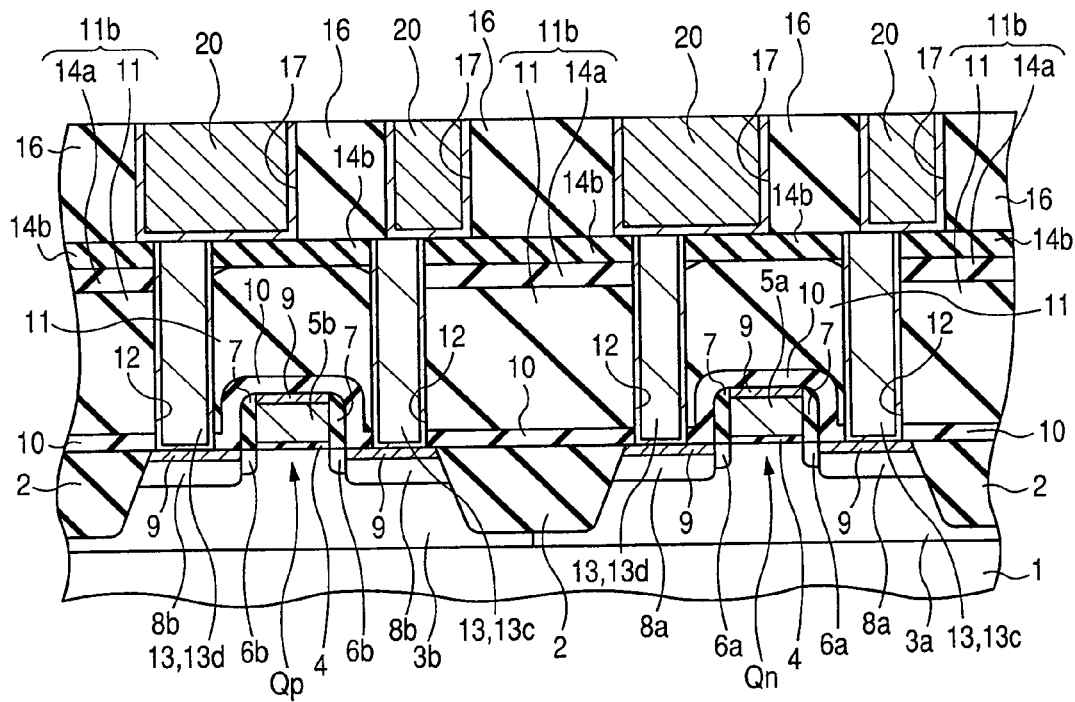
FIG. 24 is a sectional view showing a semiconductor device according to a third embodiment of the invention.

A semiconductor device in which an insulating film formed by the thermal CVD method is surely covered with an insulating film formed by the plasma CVD method will be described below. As shown in FIG. 24, in the semiconductor device of this embodiment, the insulating film 14a is formed on the insulating film 11, and an insulating film 14b is further formed on the insulating film 14a. The insulating film 11 is formed by the thermal CVD method, and the insulating films 14a and 14b are formed by the plasma CVD method, as will be described later. Since the structures of other components are the same as those of the semiconductor device shown in FIG. 1, the same members are designated by the same reference numerals, and a description thereof will be described below.

Figure 25:
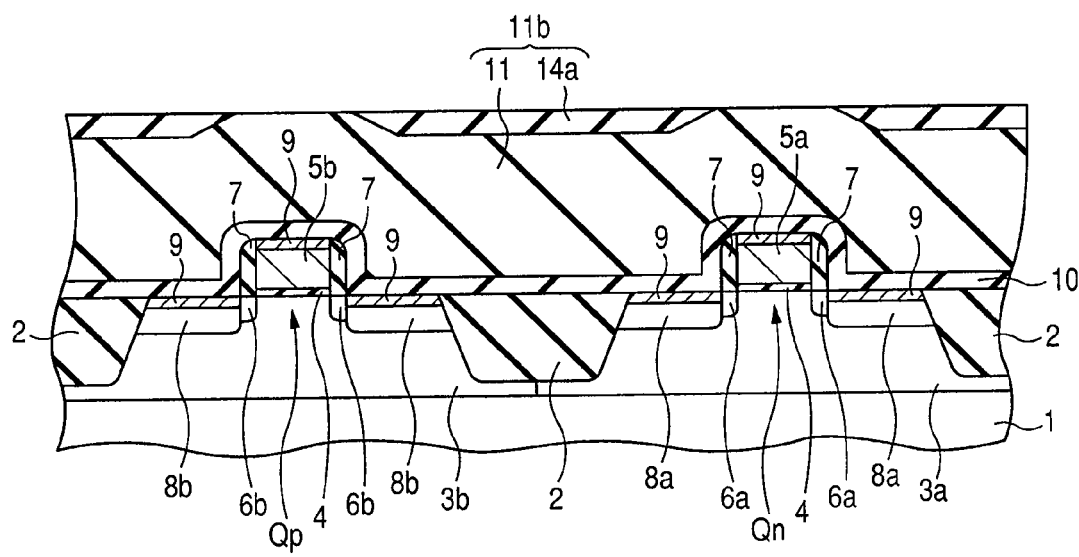
FIG. 25 is a sectional view showing one step in a manufacturing method of the semiconductor device according to the third embodiment.
Figure 26:
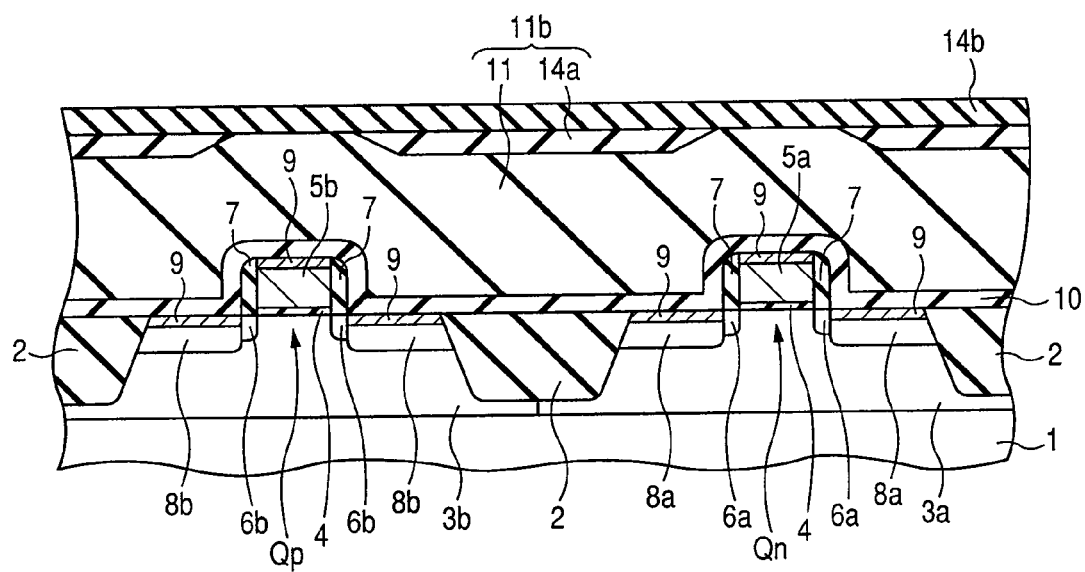
FIG. 26 is a sectional view showing another step performed after the step shown in FIG. 25 in the third embodiment.

Now, the manufacturing method of the semiconductor device described above will be described below. First, after the step shown in FIG. 19 as described above, as shown in FIG. 25, the insulating film 14a is subjected to a polishing process by the chemical mechanical polishing method. At this time, parts of the insulating film 11 covering the gate electrodes 5a and 5b are protruded, so that the surfaces of the parts of the insulating film 11 are exposed. Then, as shown in FIG. 26, the insulating film 14b is formed by the plasma CVD method over the insulating films 14a and 11. The insulating film 14b is preferably a film which is in good contact with the insulating film 14a as a lower layer, and is comprised of, preferably the same kind of film.

Figure 27:
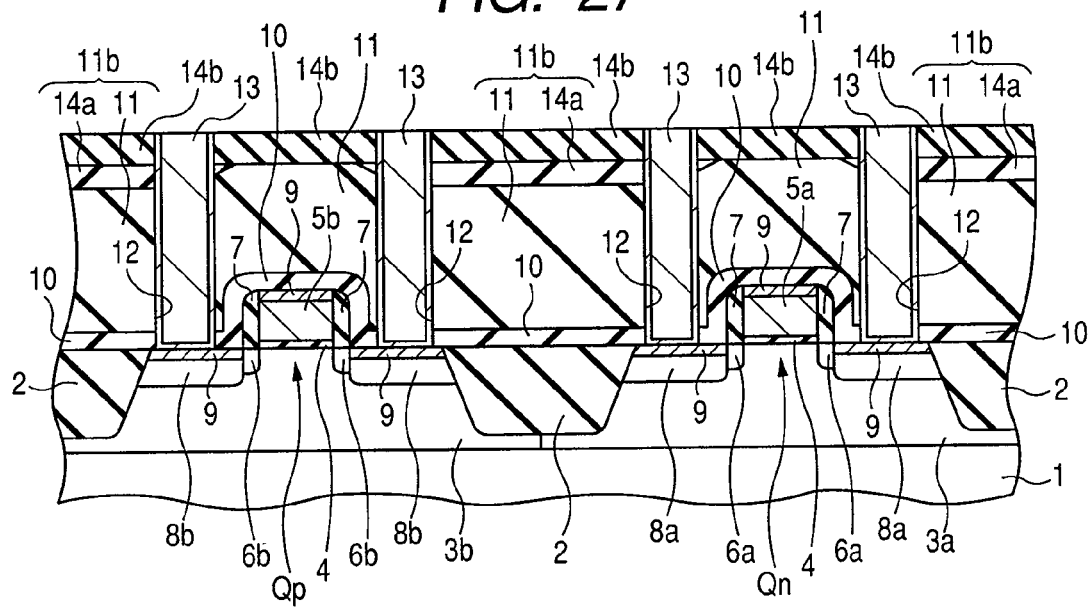
FIG. 27 is a sectional view showing another step performed after the step shown in FIG. 26 in the third embodiment.
Figure 28:
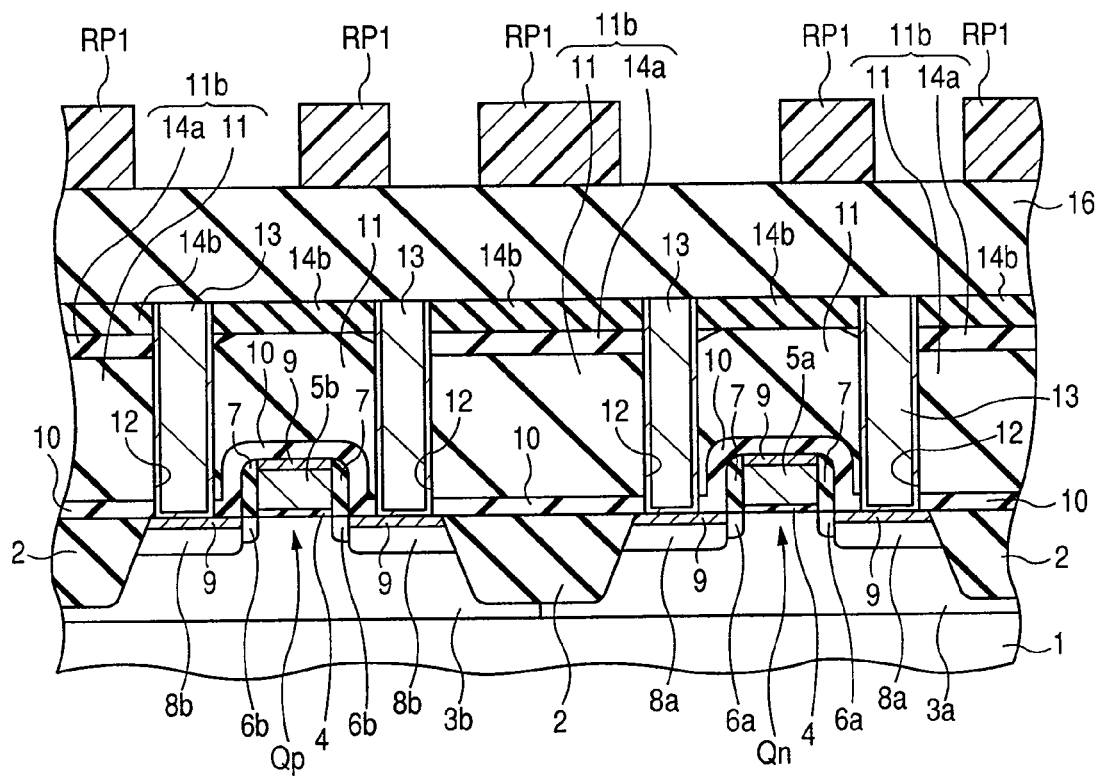
FIG. 28 is a sectional view showing another step performed after the step shown in FIG. 27 in the third embodiment.

Then, as shown in FIG. 27, contact holes 12 are formed in the insulating films 14b, 14a, and 11 in the same way as the step shown in FIG. 8. The plugs 13 are formed in the contact holes 12 in the same way as the step shown in FIG. 9. Then, wirings and the like are formed through the same steps as those shown in FIGS. 10 to 14. As shown in FIG. 28, the insulating film 16 is formed on the insulating film 14 so as to cover the plugs 13. The resist pattern RP1 is formed on the insulating film 16.

Figure 29:
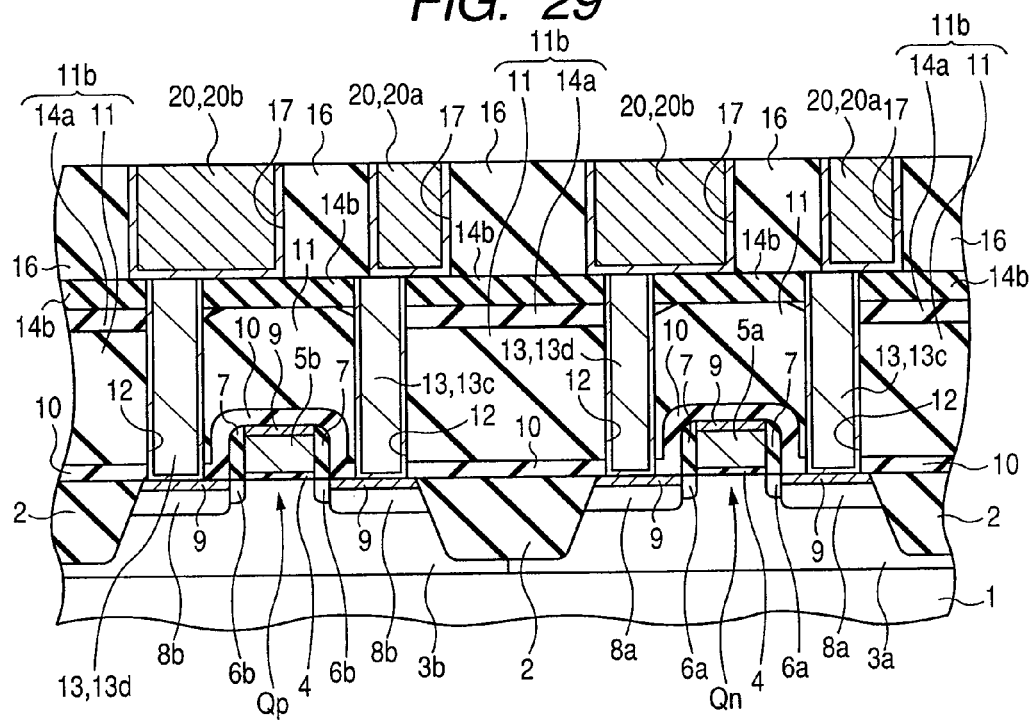
FIG. 29 is a sectional view showing another step performed after the step shown in FIG. 28 in the third embodiment.

The insulating film 16 is subjected to anisotropic etching using the resist pattern RP1 as a mask to form the openings 17 (see FIG. 29). At this time, as mentioned above, the insulating film 16 is etched using the insulating film 14b as an etching stopper to form the openings 17 in the insulating film 16. Then, as shown in FIG. 29, each wiring 20 is formed in the opening 17. Thereafter, the insulating films 22, 23, 24, the openings 30, 31, and the wiring 34 are formed in the same way as the steps shown in FIGS. 15 and 16 (see FIGS. 15 and 16).

According to the manufacturing method of the semiconductor device as described above, the following effects can be obtained in addition to the effect associated with the above-mentioned first embodiment. That is, for example, in cases where it is difficult to reserve the remaining film part of the insulating film 14a in polishing the insulating film 14a, the insulating film 14b is formed to cover the insulating film 14a, whereby only a predetermined thickness of the insulating films 14a and 14b can be ensured over the insulating film 11. Further, even when the surface of the insulating film 11 is exposed in polishing the insulating film 14a, the insulating film 11 exposed is covered with the insulating film 14b. Thus, moisture in the insulating film 11, which contains a relatively great amount of moisture by being formed by the thermal CVD method, can be surely prevented from being diffused upward, which can further improve the electrical reliability.

Fourth Embodiment

Now, a fourth embodiment of the invention will be described. That is, the plug is metal other than copper, and an insulating film having the plug formed therein is comprised of the same main component as that of another insulating film which is located adjacent to the above-mentioned insulating film, and which has a wiring formed therein.

Figure 30:
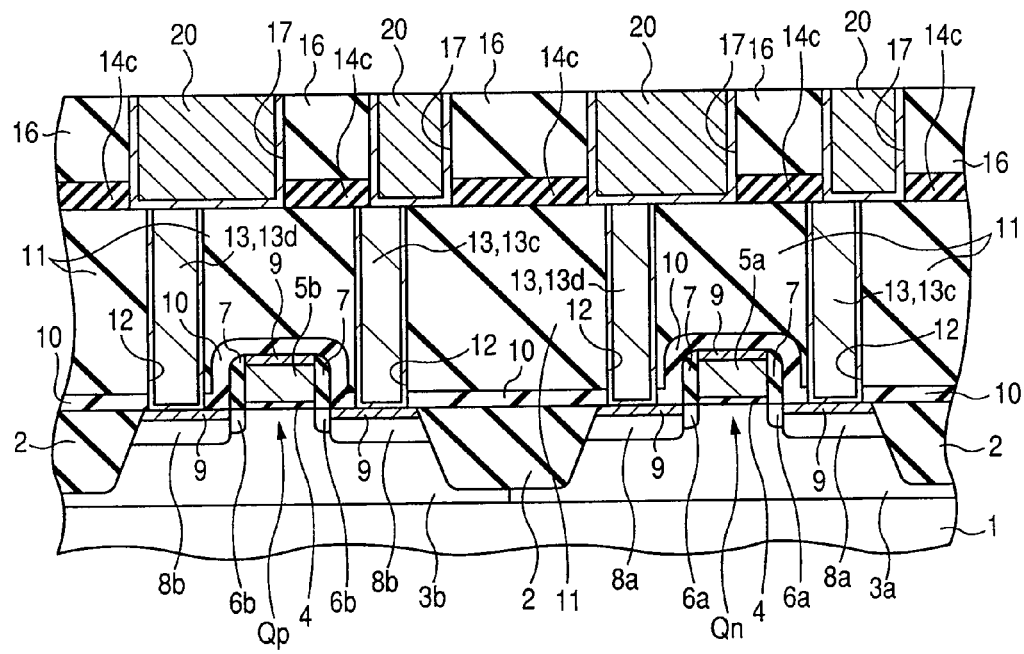
FIG. 30 is a sectional view showing a semiconductor device according to a fourth embodiment of the invention.

As shown in FIG. 30, in the semiconductor device according to this embodiment, the plug 13 comprised of metal other than copper is formed in the insulating film 11 formed by the thermal CVD method, and the insulating film 14c is formed over the insulating film 11 by the plasma CVD method so as to cover the plug 13. The insulating film 16 is formed over the insulating film 14c. The openings 17 are formed in the insulating films 16 and 14 to be exposed to the surface of the plug 13. Each wiring 20 is formed in the opening 17. Since the structures of other components are the same as those of the semiconductor device shown in FIG. 1, the same members are designated by the same reference numerals, and a description thereof will be described below.

Figure 31:
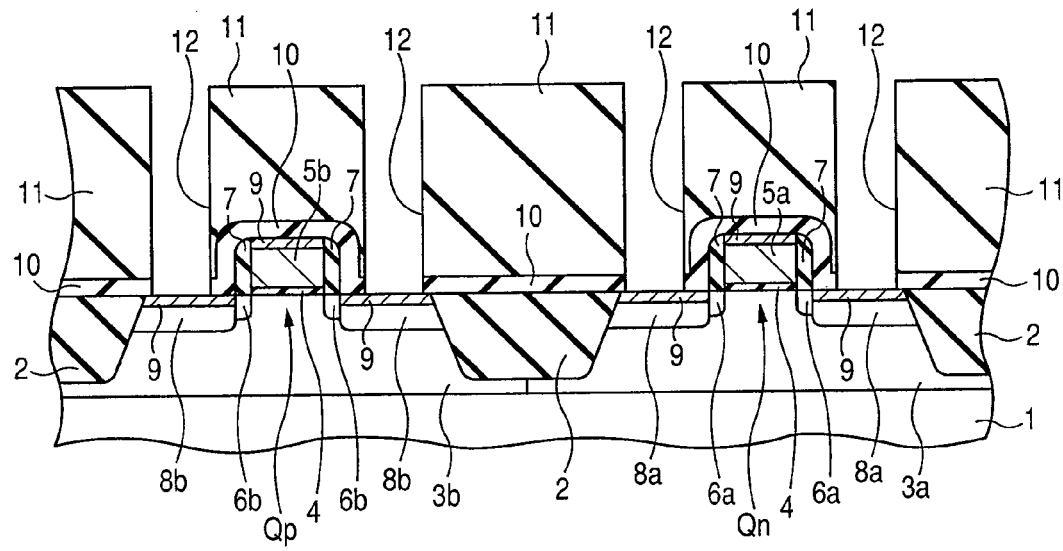
FIG. 31 is a sectional view showing one step in a manufacturing method of the semiconductor device according to the fourth embodiment.
Figure 32:
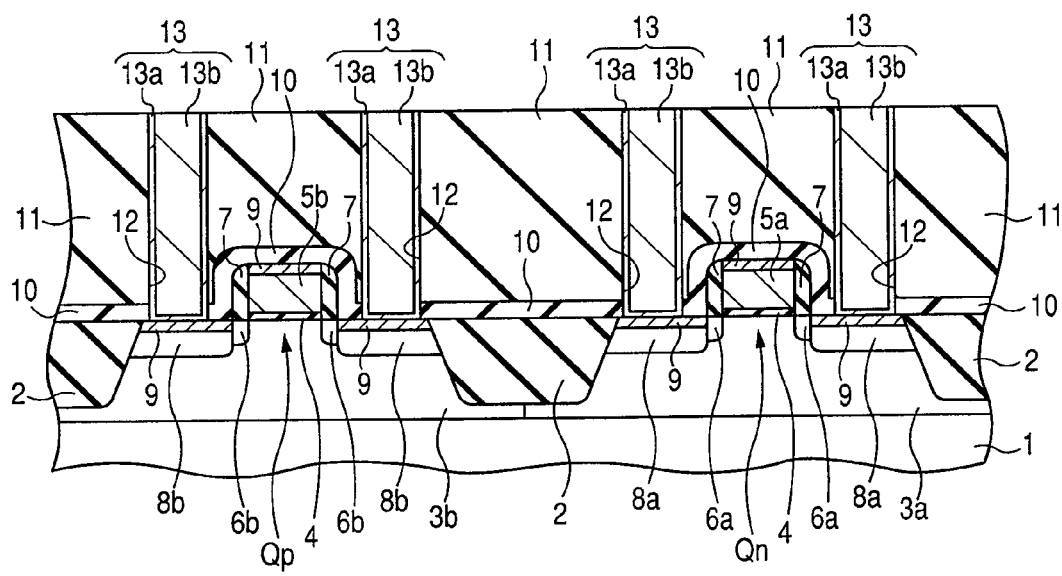
FIG. 32 is a sectional view showing another step performed after the step shown in FIG. 31 in the fourth embodiment.

Now, the manufacturing method of the semiconductor device described above will be described below. After the same steps as the above-mentioned steps shown in FIGS. 2 to 6, as shown in FIG. 31, contact holes 12 for exposing the surfaces of $n^+$-type semiconductor region 8a and $p^+$-semiconductor region 8b are formed in the insulating films 11 and 10. Contact holes (not shown) for exposing the surfaces of the gate electrodes 5a and 5b are also formed. Then, as shown in FIG. 32, the plugs 13 are formed in the contact holes 12. The plug 13 is comprised of a conductor 13b and a conductive barrier film 13a which are formed of metal other than copper, for example, tungsten or the like.

Figure 33:
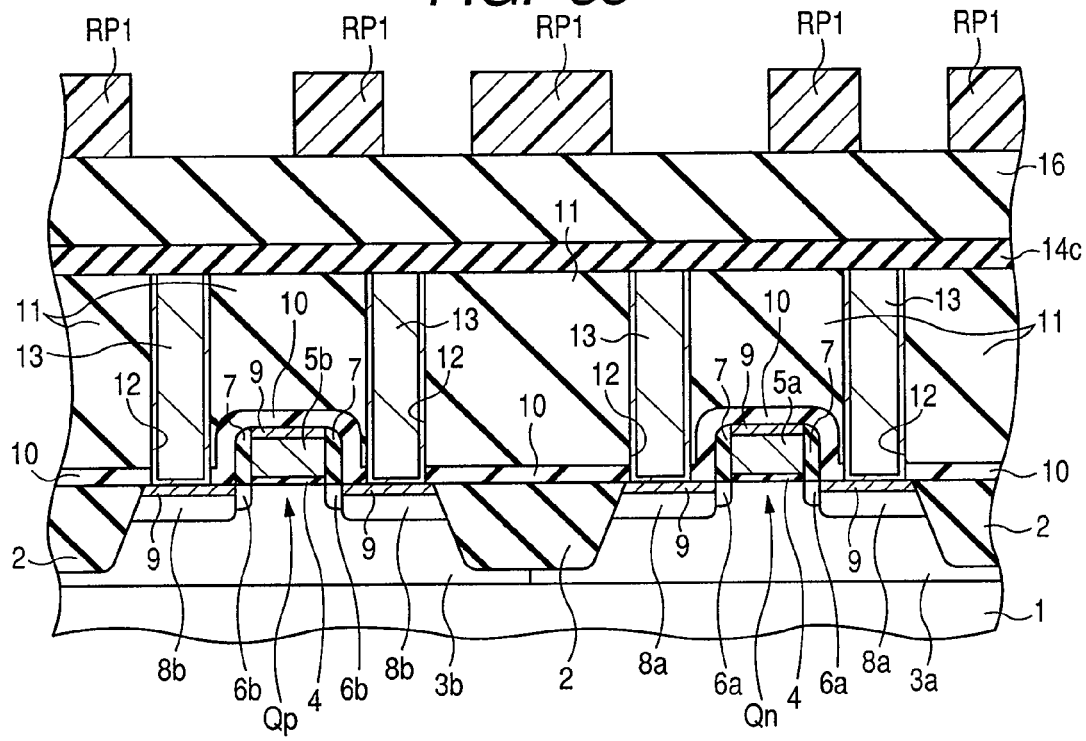
FIG. 33 is a sectional view showing another step performed after the step shown in FIG. 32 in the fourth embodiment.

Then, as shown in FIG. 33, the insulating film 14c is formed over the insulating film 11 so as to cover the plug 13. As mentioned above, the insulating film 11 formed by the thermal CVD method has a high hygroscopic property, and thus tends to contain a large amount of moisture. Thus, when the insulating film having the low humidity resistance is formed over the insulating film 11, a dielectric breakdown route may be formed at the interface between the insulating film and the insulating film 11, leading to reduce resistance to dielectric breakdown.

In order not to form the dielectric breakdown route at the interface between the insulating films 14c and 11, the insulating film 14c is preferably formed by the plasma CVD method. The inventors have confirmed that before forming the insulating film 14c, the insulating film 11 is subjected to an annealing process at a temperature of about 400 to 500° C. for about 20 minutes, which can remove moisture contained in the insulating film 11. Thus, after forming the plugs 13 and before forming the insulating film 14c, the annealing process is performed.

Further, the principal components of the insulating film 14c are preferably the same as those of the insulating film 11. The principal components of the insulating film 14c are preferably silicon (Si) and oxygen (O). Typical materials for the insulating films include a silicon oxide film formed by the plasma CVD method using TEOS gas as a raw material, and a silicon oxide film or a nitride containing silicon oxide film formed by the plasma CVD method using silane-based gas as raw material.

Then, the insulating film 16 is formed on the insulating film 14c. The insulating film 14c is formed for the purpose of preventing the damage to the lower layer due to over-etching or the decrease in dimensional accuracy of the process when forming trenches or holes for forming wirings in the insulating film 16 by etching. That is, the insulating film 14c can function as the etching stopper when applying etching to the insulating film 16. Thus, the insulating film 14c and the insulating film 16 are preferably formed of different materials so as to have different etching rates from each other. The insulating film 16 is preferably a low-k film, like in the above-mentioned semiconductor device.

Figure 34:
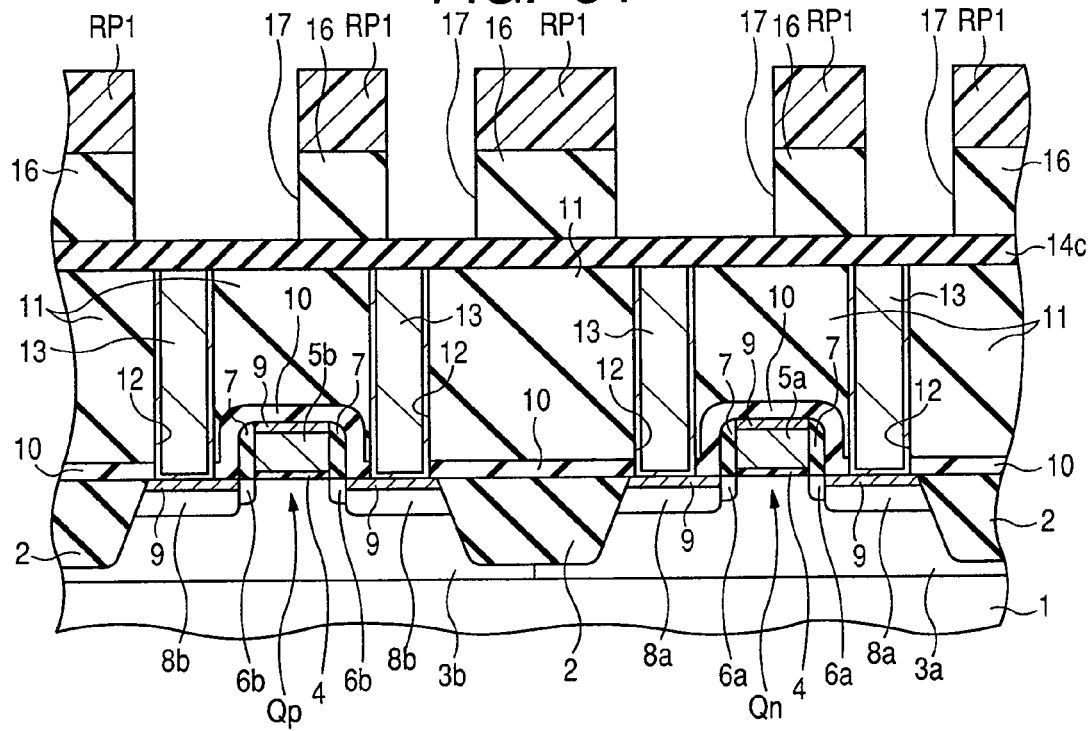
FIG. 34 is a sectional view showing another step performed after the step shown in FIG. 33 in the fourth embodiment.
Figure 35:
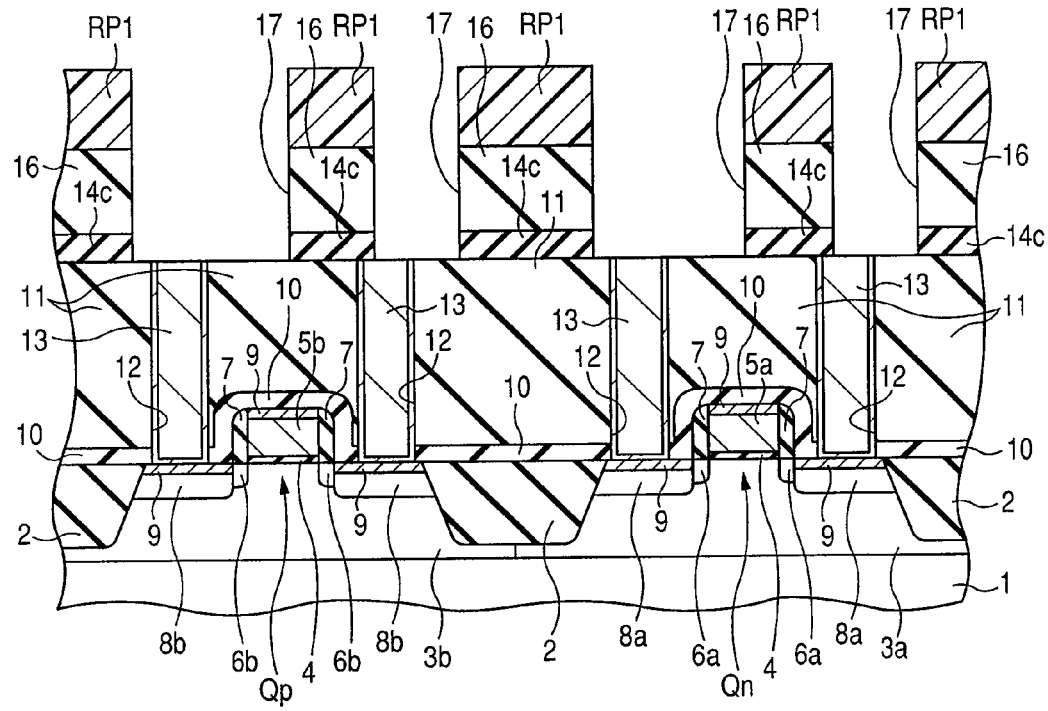
FIG. 35 is a sectional view showing another step performed after the step shown in FIG. 34 in the fourth embodiment.

Then, a predetermined resist pattern RP1 is formed on the insulating film 16 by a photolithography method. As shown in FIG. 34, the insulating film 16 is dry-etched using the resist pattern RP1 as an etching mask, thereby selectively removing the insulating film 16, so that the openings 17 for exposing the surface of the insulating film 14c are formed. At this time, the insulating film 16 is etched on a condition where the insulating film 16 is more easily dry-etched than the insulating film 14c, while the insulating film 14c as a lower layer can serve as an etching stopper film. Then, as shown in FIG. 35, the parts of the insulating film 14c exposed to the bottoms of the openings 17 are subjected to dry etching using the resist pattern RP1 as a mask, whereby new openings 17 for exposing the surfaces of the plugs 13 are formed. Thereafter, the resist pattern RP1 is removed.

Figure 36:
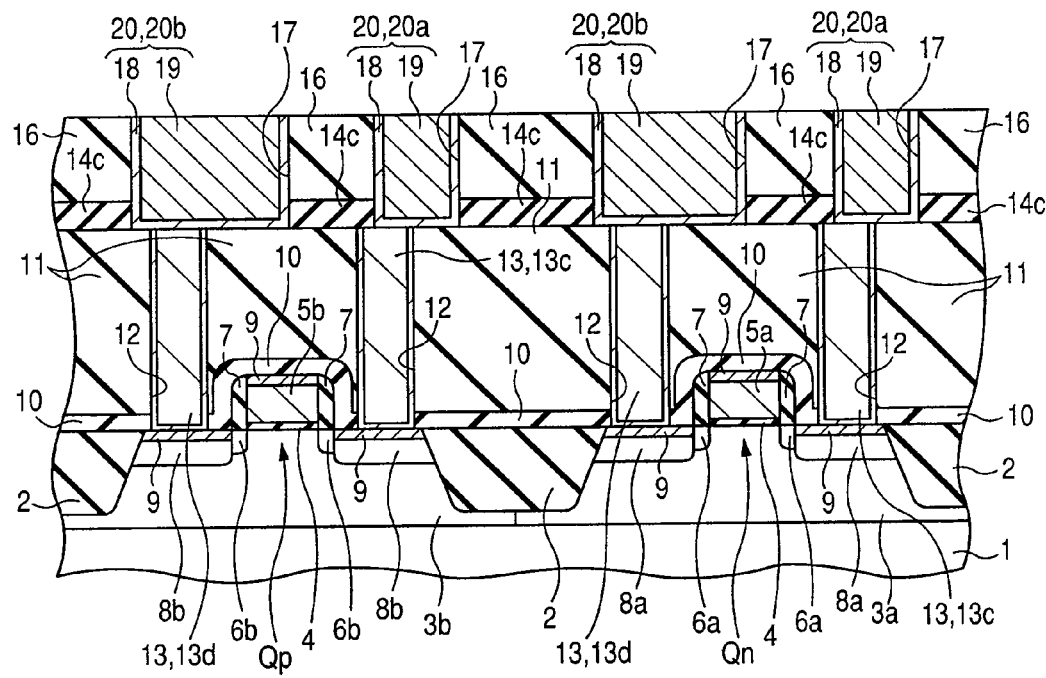
FIG. 36 is a sectional view for explaining the operation and effect of an insulating film in the fourth embodiment.

Then, as shown in FIG. 36, the wiring 20 including the conductive barrier film 18 and the main conductive film 19 is formed in each opening 17. The conductive barrier film 18 is formed of, for example, a tantalum (Ta) film, a tantalum nitride (TaN) film, or a lamination of these films. The main conductive film 19 is formed of, for example, copper or copper alloy. In this way, the main portions of the semiconductor device are formed.

In the manufacturing method of the semiconductor device described above, the insulating film 11 formed by the thermal CVD method and having the high hygroscopic property of moisture is subjected to the thermal treatment to have the moisture removed therefrom, and then covered with the insulating film 14 having the same component as that of the insulating film 11 and formed by the plasma CVD method to have the high humidity resistance. Thus, the contact of the interface between the insulating films 11 and 14c is improved to remove the moisture from the insulating film 11, which can suppress the formation of the dielectric breakdown route at the interface. As a result, the reliability of the semiconductor device can be improved.

Further, in the semiconductor device of this embodiment, like the above-mentioned semiconductor device, the positional displacement between the opening 17 and the plug 13 is allowed, and at least a part of the upper surface of the plug 13 may be exposed from the opening 17 and in contact with the wiring 20. Thus, the plug 13d among the plugs 13 has the entire upper surface in contact with the wiring 20, and the plug 13c has only a part of the upper surface in contact with the wiring 20, and the other part of the upper surface covered with the insulating film 16. That is, the plug 13c has a part of the upper surface in contact with the wiring 20, and the remaining part of the upper surface covered with the insulating film 16.

In such a case, a distance between the plug 13c and a wiring 20b adjacent to a wiring 20a coupled to the plug 13c is shorter than the smallest distance between the adjacent wirings 20 (the distance between the wiring 20a and the wiring 20b), which may easily cause dielectric breakdown at an interface between the insulating film 14 and the insulating film 16 between the plug 13c and the wiring 20b which are close to each other.

Thus, the insulating film 11 containing the relatively great amount of moisture is subjected to the thermal treatment to have the moisture removed therefrom, and additionally the insulating film 14c having the same principal component as that of the insulating film 11 and having the high humidity resistance is formed, which can prevent the formation of the electrically weak dielectric breakdown route between the plug 13c and the wiring 20b. Thus, even when the plug 13c gets close to the wiring 20b, the occurrence of dielectric breakdown between the plug 13c and the wiring 20b can be prevented. The plug 13 is comprised of metal other than copper, so that the copper is diffused into the insulating film 14c, which prevents the predetermined plug 13 from being electrically connected to a wiring other than the wiring coupled to the plug 13.

When the plug 13 contains copper (Cu), the insulating film 14c is preferably a silicon oxide nitride (SiON) film. The silicon oxide nitride (SiON) film containing silicon (Si), oxygen (O), and nitrogen (N) has the function of suppressing or preventing the diffusion of copper. For the plug 13 containing copper (Cu), the insulating film 14c comprised of a silicon oxide nitride film (SiON) can suppress or prevent the diffusion of copper (Cu) of the plug 13 into the insulating film 14c even when a part of the upper surface of the plug 13c is covered with the insulating film 14c due to the positional displacement between the opening 17 and the plug 13. Thus, the dielectric breakdown can be surely prevented from occurring between the plug 13c and the wiring 20b.

The semiconductor device of this embodiment assumes that the plug 13 contains copper (Cu) as described above. When the main conductive film 13b serving as the plug 13 contains, for example, tungsten (W) as a principal component, it is not necessary to take into consideration the diffusion of copper from the plug 13 into the insulating film 14c. Thus, any one of the silicon oxide ($SiO_x$) film and silicon oxide nitride (SiON) film may be used as the insulating film 14c. Taking into consideration the dielectric constant, the silicon oxide ($SiO_x$) film may be preferably used. Since the silicon oxide ($SiO_x$) film can reduce the dielectric constant more effectively than the silicon oxide nitride (SiON) film, the use of the silicon oxide ($SiO_x$) film as the insulating film 14c can reduce more the parasitic capacity between the adjacent wirings 20.

Fifth Embodiment

Now, a fifth embodiment of the invention will be described below. That is, the plug is comprised of metal containing copper, and an insulating film having a wiring formed therein adjacent to an insulating film having the plug formed therein is an insulating film for preventing the diffusion of copper.

Figure 37:
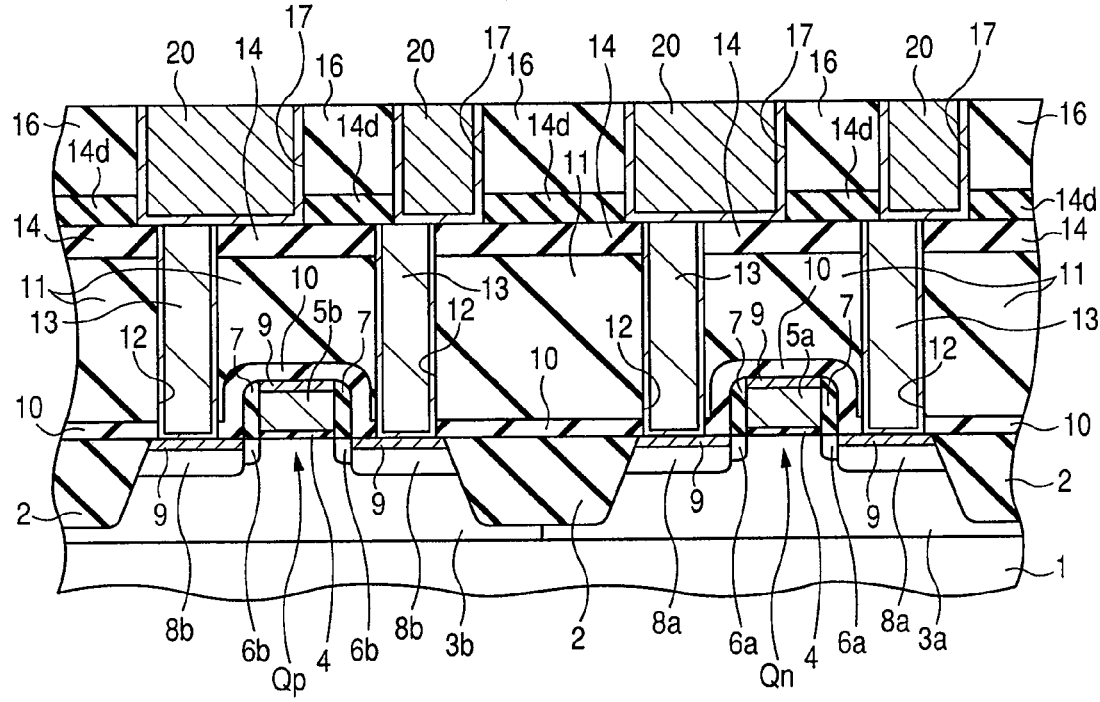
FIG. 37 is a sectional view showing a semiconductor device according to a fifth embodiment of the invention.

As shown in FIG. 37, in the semiconductor device according to this embodiment, the insulating film 14 is formed by the plasma CVD method on the insulating film 11 formed by the thermal CVD method. The plugs 13 are formed in the insulating films 14 and 11. The insulating film 14d is formed on the insulating film 14 by the plasma CVD method so as to cover the plugs 13. The insulating film 16 is formed on the insulating film 14d. Opening 17 exposing the surfaces of the plugs 13 are formed in the insulating films 16 and 14, and the wirings 20 are formed in the openings 17. Since the structures of other components are the same as those of the semiconductor device shown in FIG. 1, the same members are designated by the same reference numerals, and a description thereof will be described below.

Figure 38:
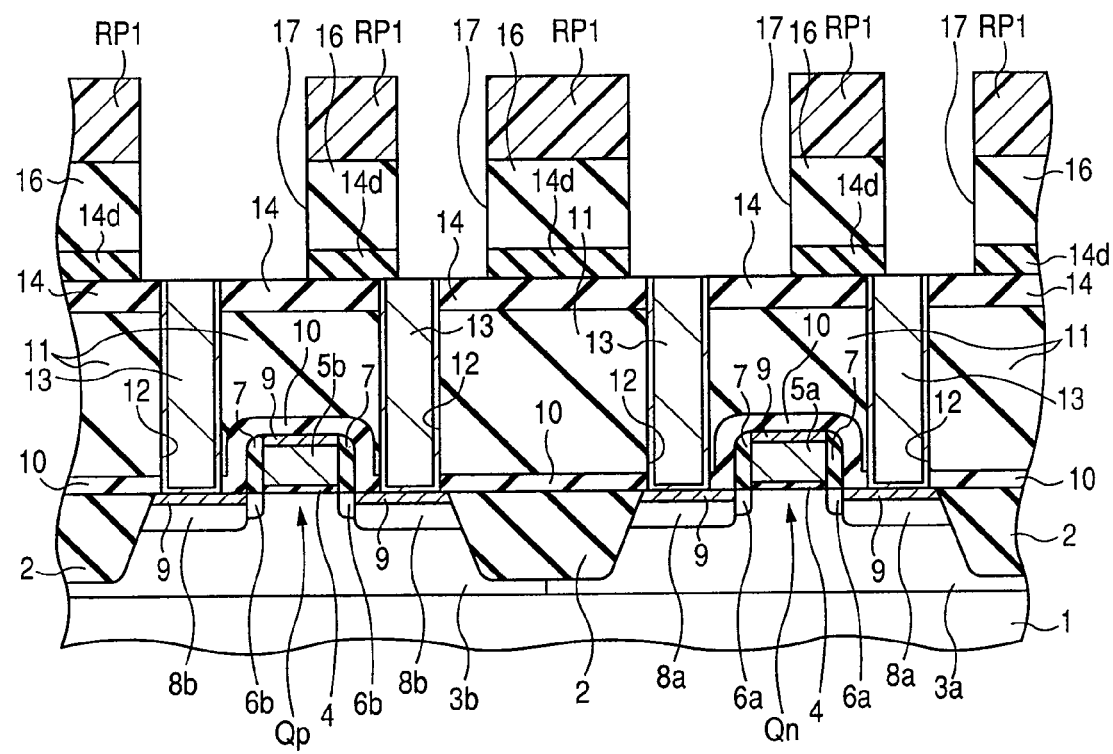
FIG. 38 is a sectional view showing one step in a manufacturing method of the semiconductor device according to the fifth embodiment.
Figure 39:
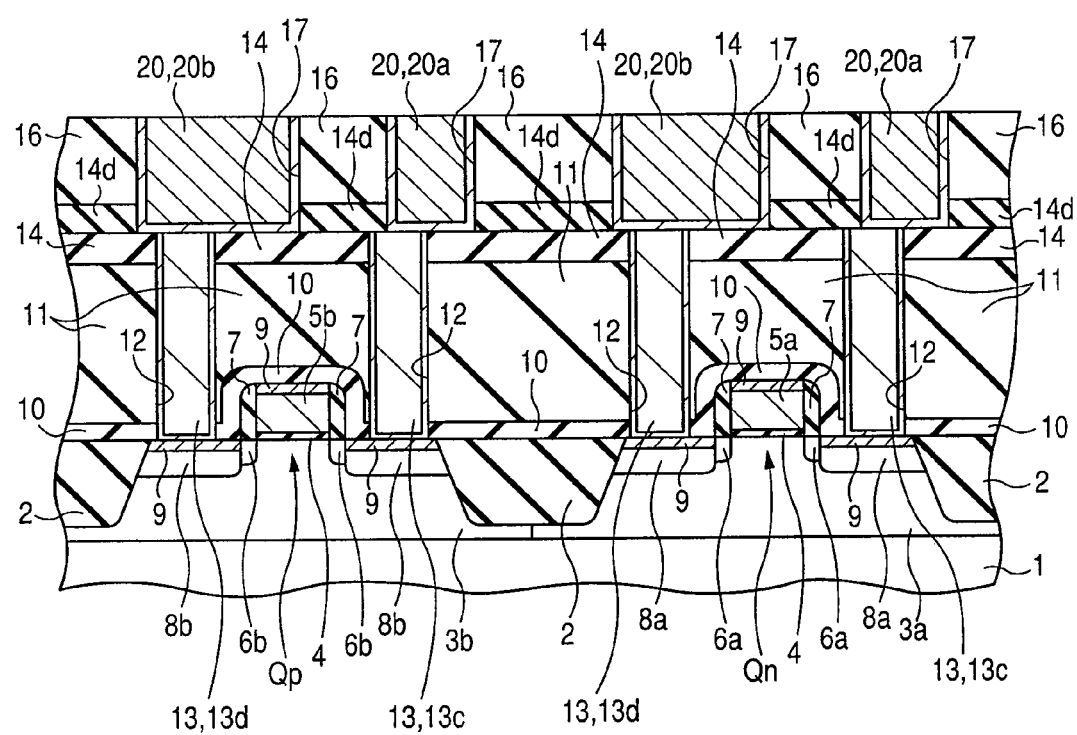
FIG. 39 is a sectional view showing another step performed after the step shown in FIG. 38 in the fifth embodiment.

Now, the manufacturing method of the semiconductor device described above will be described below. After the same steps as those shown in FIGS. 2 to 9 as described above, as shown in FIG. 38, the insulating film 14d is formed on the insulating film 14 by the plasma CVD method so as to cover the plugs 13. The insulating film 16 is further formed on the insulating film 14d. The resist pattern RP1 is formed on the insulating film 16. Then, the insulating film 16 and the insulating film 14d are subjected to anisotropic etching using the resist pattern RP1 as a mask to form the openings 17 for exposing the surface of the plugs 13. Thereafter, the resist pattern RP1 is removed. As shown in FIG. 39, the wiring 20 is formed in the opening 17. In this way, the main portions of the semiconductor device are formed.

In the manufacturing method of the semiconductor device described above, the insulating film 11 formed by the thermal CVD method to have the high hygroscopic property of moisture is covered with the insulating film 14 formed by the plasma CVD method to have the high humidity resistance as described in the first embodiment. Thus, the moisture contained in the insulating film 11 is prevented from being diffused upward from the insulating film 11, so that the dielectric breakdown route can be prevented at the interface between the insulating films 14 and 14d. As a result, the wiring 20 can be surely coupled electrically to the plug 13, and the insulation between the adjacent wirings 20 can be ensured, which can assure the reliability of the semiconductor device.

In the semiconductor device of this embodiment, the plug 13 is comprised of metal containing copper, and the insulating film 14d is an insulating film containing silicon (Si) and nitrogen (N). The insulating film containing silicon (Si) and nitrogen (N) has the function of suppressing or preventing the diffusion of copper. For the plug 13 containing copper (Cu), such an insulating film 14d comprised of silicon (Si) and nitrogen (N) can suppress or prevent the diffusion of copper (Cu) of the plug 13 into the insulating film 14d even when a part of the upper surface of the plug 13c is covered with the insulating film 14d due to the positional displacement between the opening 17 and the plug 13. Thus, the dielectric breakdown can be surely prevented from occurring between the plug 13c and the wiring 20b.

The insulating films containing silicon (Si) and nitrogen (N) in use can include, in addition to the silicon nitride (SiN) film, a silicon oxide nitride (SiON) film containing silicon (Si), oxygen (O), and nitrogen (N), and a silicon carbide nitride (SiCN) film containing silicon (Si), carbon (C), and nitrogen (N).

When the insulating film 14d is the silicon oxide nitride (SiON) film, the composition ratio of nitrogen (N) to silicon (Si) in the insulating film 14d, that is, the ratio of the number of atoms of nitrogen (N) to silicon (Si) (N atom number/Si atom number) is preferably equal to or more than 0.01. In this case, the insulating film 14d has the ratio of the nitrogen (N) content to the silicon (Si) content of 1% or more in terms of the ratio of the number of atoms. When the composition of the insulating film 14d is represented by "$SiO_xN_y$", the reference numeral Y is equal to or more than 0.01 ($Y \geq 0.01$). Thus, the insulating film 14d prevents the diffusion of copper into the plug 13, which can surely prevent occurrence of the dielectric breakdown between the plug 13c and the wiring 20b.

The higher the content of nitrogen (N) in the insulating film 14d, the higher the dielectric constant of the insulating film 14d, thus leading to an increase in parasitic capacity between the wirings 20. Thus, when the insulating film 14d is the silicon oxide nitride (SiON) film, the composition ratio of nitrogen (N) to silicon (Si) in the insulating film 14d, that is, the ratio of the number of atoms of nitrogen (N) to silicon (Si) (N atom number/Si atom number) is preferably not less than 0.01 nor more than 0.2. In this case, the insulating film 14d has the ratio of the nitrogen (N) content to that of the silicon (Si) content of not less than 1% nor more than 20% in terms of the ratio of the number of atoms. When the composition of the insulating film 14d is represented by "$SiO_xN_y$", the reference character Y of the "$SiO_xN_y$" is not less than 0.01 nor more than 0.2 ($0.01 \leq Y \leq 0.2$). This can achieve both the effect of improvement of resistance to dielectric breakdown between the plug 13c and the wiring 20b because of improvement of the barrier property against copper of the insulating film 14d, and the effect of reduction of the parasitic capacity between the wirings 20.

In the fourth embodiment, after forming the insulating film 11 for covering the gate electrodes 5a and 5b by the thermal CVD method, and before forming the insulating film 14 by the plasma CVD method, the insulating film 11 is subjected to the annealing process at a temperature of 400 to 500° C. for about 20 minutes, whereby moisture contained in the insulating film 11 is removed. The annealing process can also be applied to the semiconductor devices of not only the fourth embodiment, but also other embodiments. The insulating film 11 is subjected to the annealing process thereby to remove the moisture contained in the insulating film 11, which can further improve the resistance to dielectric breakdown.

In the actual application, at least the insulating film 11 formed by the thermal CVD method is subjected to the annealing process, while being partly exposed, so that the moisture is effectively removed from the insulating film 11 exposed. In the first and fifth embodiments, the annealing process is performed any one of between the step of forming the insulating film 11 and the step of planarization by applying a chemical mechanical polishing process to the insulating film 11, between the step of planarization by applying the chemical mechanical polishing process to the insulating film 11 and the step of forming the insulating film 14 on the insulating film 11 by the plasma CVD method, and between the step of forming the contact hole 12 and the step of forming the plug 13. In the second and third embodiments, the annealing process is performed either between the step of forming the insulating film 11 and the step of forming the insulating film 14, or between the step of forming the contact hole 12 and the step of forming the plug 13.

Although the insulating film formed by the thermal CVD method has been explained as one example of the insulating film 11, the insulating film 11 may be an SOG film formed by a spin-on glass method, or a lamination of an SOG film and a film formed by the thermal CVD method.

The preferred embodiments disclosed herein are illustrative, and the invention is not limited thereto. It will nevertheless be understood that the scope of the invention is, therefore, indicated by the appended claims rather than by the foregoing description. All changes which come within the meaning and range of equivalency of the claims are to be embraced within the scope.

What is claimed is:

1. A manufacturing method of a semiconductor device, comprising the steps of:
   forming a first gate electrode and a second gate electrode over a semiconductor substrate having a main surface, said first and second gate electrodes being spaced apart from each other;
   forming a first interlayer insulating film in a region between the first gate electrode and the second gate electrode over the semiconductor substrate by at least one of a thermal chemical vapor deposition method and a coating method in such a manner that the first interlayer insulating film is at a higher level than those of the first gate electrode and the second gate electrode;
   forming a second interlayer insulating film over the first interlayer insulating film by a plasma chemical vapor deposition method;
   forming a first plug electrode through the second interlayer insulating film and the first interlayer insulating film, said first plug electrode being electrically coupled to the semiconductor substrate;
   forming a third interlayer insulating film having a predetermined dielectric constant over the second interlayer insulating film by the plasma chemical vapor deposition method so as to cover the first plug electrode, a bottom portion of the third interlayer insulating film connecting to a top portion of the second interlayer insulating film;
   forming a wiring trench for exposing the second interlayer insulating film and the first plug electrode by etching the third interlayer insulating film; and
   electrically coupling a wiring to the semiconductor substrate via the first plug electrode by forming the wiring in the wiring trench,
   wherein in the step of forming the third interlayer insulating film, a silicon oxide carbide (SiOC) film or a silicon oxide fluoride (SiOF) film is formed as the third interlayer insulating film.

2. The manufacturing method of a semiconductor device according to claim 1,
   wherein in the step of forming the first interlayer insulating film, an ozone TEOS film is formed as the first interlayer insulating film by, the thermal chemical vapor deposition method,
   wherein in the step of forming the second interlayer insulating film, any one film selected from the group comprising a plasma TEOS film, a silicon oxide film, a silicon oxide nitride (SiON) film, a silicon carbide nitride (SiCN) film, and a silicon oxide carbide (SiOC) film is formed as the second interlayer insulating film by the plasma chemical vapor deposition method.

3. The manufacturing method of a semiconductor device according to claim 1, further comprising a step of:
   after the step of forming the first interlayer insulating film and before the step of forming the second interlayer insulating film, planarizing the first interlayer insulating film by applying a chemical mechanical polishing process to the first interlayer insulating film.

4. The manufacturing method of a semiconductor device according to claim 1, further comprising a step of
   after the step of forming the second interlayer insulating film and before the step of forming the first plug, planarizing the second interlayer insulating film by applying the chemical mechanical polishing process to the second interlayer insulating film.

5. The manufacturing method of a semiconductor device according to claim 1, wherein the step of forming the second interlayer insulating film comprises the steps of:
   forming a first layer over the first interlayer insulating film;
   planarizing the first layer by applying the chemical mechanical polishing process to the first layer; and
   forming a second layer over the planarized first layer.

6. The manufacturing method of a semiconductor device according to claim 1, wherein, in etching for forming the wiring trench, an etching rate of the third interlayer insulating film is three or more times as high as that of the second interlayer insulating film.

7. The manufacturing method of a semiconductor device according to claim 1, further comprising a step of:
   after the step of forming the first interlayer insulating film and before the step of forming the second interlayer insulating film, applying a predetermined thermal treatment for removing moisture contained in the first interlayer insulating film.

8. The manufacturing method of a semiconductor device according to claim 1 or 2, further comprising a step of:
   between the step of forming the first gate electrode and the second gate electrode and the step of forming the first interlayer insulating film, forming nickel silicide films at respective surfaces of source and drain regions formed on both sides of the first gate electrode, and of source and drain regions formed on both sides of the second gate electrode.

9. A semiconductor device, comprising:
   a semiconductor substrate having a main surface;
   a first gate electrode and a second gate electrode formed over the semiconductor substrate such that the first and second gate electrodes are spaced apart from each other;
   a first interlayer insulating film formed in a region between the first gate electrode and the second gate electrode over the semiconductor substrate in such a manner that the first interlayer insulating film is at a higher level than those of the first gate electrode and the second gate electrode, said first interlayer insulating film having a predetermined content density of moisture and OH group, and said first interlayer insulating film having a predetermined dielectric constant;
   a second interlayer insulating film formed over the first interlayer insulating film, said second interlayer insulating film having a content density of moisture and OH group lower than the predetermined content density, and said second interlayer insulating film having another predetermined dielectric constant;
   a first plug electrode formed through the second interlayer insulating film and the first interlayer insulating film, said first plug electrode being electrically coupled to the semiconductor substrate;
   a third interlayer insulating film formed over the second interlayer insulating film so as to cover the first plug electrode, said third interlayer insulating film being comprised of material having a further predetermined dielectric constant lower than the respective predetermined dielectric constants of the first and second interlayer insulating films, and lower than a dielectric constant of a silicon oxide film, said third interlayer insulating film having a content density of moisture and OH group lower than the predetermined content density, a bottom portion of the third interlayer insulating film connecting to a top portion of the second interlayer insulating film;
   a wiring trench exposing the second interlayer insulating film and the first plug electrode through the third interlayer insulating film; and a wiring formed in the wiring trench and electrically coupled to the semiconductor substrate via the first plug electrode.

10. The semiconductor device according to claim 9, wherein the first interlayer insulating film is an ozone TEOS film, wherein the second interlayer insulating film is any one film selected from the group comprising a plasma TEOS film, a silicon oxide film, a silicon oxide nitride (SiON) film, a silicon carbide nitride (SiCN) film, and a silicon oxide carbide (SiOC) film, and wherein the third interlayer insulating film is a silicon oxide carbide (SiOC) film or a silicon oxide fluoride (SiOF) film.

11. The semiconductor device according to claim 9 or 10, wherein the second interlayer insulating film includes a first layer formed over the first interlayer insulating film, and a second layer formed over the first layer planarized.

* * * * *